(12) United States Patent
Ueda et al.

(10) Patent No.: US 10,730,697 B2
(45) Date of Patent: Aug. 4, 2020

(54) ARTICLE TRANSPORT APPARATUS

(71) Applicant: Daifuku Co., Ltd., Osaka-shi (JP)

(72) Inventors: Yuichi Ueda, Hinocho (JP); Masashige Iwata, Hinocho (JP); Akira Emoto, Hinocho (JP)

(73) Assignee: Daifuku Co., Ltd., Osaka-shi (JP)

(*) Notice: Subject to any disclaimer, the term of this patent is extended or adjusted under 35 U.S.C. 154(b) by 0 days.

(21) Appl. No.: 16/077,788

(22) PCT Filed: Feb. 15, 2017

(86) PCT No.: PCT/JP2017/005463
§ 371 (c)(1),
(2) Date: Aug. 14, 2018

(87) PCT Pub. No.: WO2017/141951
PCT Pub. Date: Aug. 24, 2017

(65) Prior Publication Data
US 2019/0210802 A1 Jul. 11, 2019

(30) Foreign Application Priority Data
Feb. 18, 2016 (JP) .................................. 2016-029209

(51) Int. Cl.
*B65G 1/04* (2006.01)
*H05K 7/14* (2006.01)

(52) U.S. Cl.
CPC ......... *B65G 1/0492* (2013.01); *B65G 1/0407* (2013.01); *B65G 1/0435* (2013.01);
(Continued)

(58) Field of Classification Search
CPC .. B65G 1/0407; B65G 1/0435; B65G 1/0428; G11B 15/682; G11B 15/68; G11B 15/6835; G11B 17/225
See application file for complete search history.

(56) References Cited

U.S. PATENT DOCUMENTS 3,762,531 A 10/1973 Lee
3,809,259 A * 5/1974 Pipes ................... B65G 1/0435
414/280
(Continued)

FOREIGN PATENT DOCUMENTS

CN 102336381 A 2/2012
DE 4028059 A1 3/1992
(Continued)

*Primary Examiner* — Kaitlin S Joerger
(74) *Attorney, Agent, or Firm* — The Webb Law Firm

(57) ABSTRACT

Provided is an article transport apparatus which can transfer an article to a transfer target portion at a low height. A movable member having a support portion includes a transfer mechanism for moving an article between the support portion and a transfer target portion. The transfer mechanism includes an interlocking portion capable of being interlocked with an article along the front-and-back direction, a first guide portion for guiding the interlocking portion along the front-and-back direction, and a second actuator for moving the interlocking portion along the front-and-back direction. The transfer mechanism moves an article between the support portion and the transfer target portion by moving the interlocking portion along the front-and-back direction. The first guide portion and the second actuator are located higher than an article supported by the support portion.

34 Claims, 15 Drawing Sheets

(52) U.S. Cl.
CPC ....... *H05K 7/1489* (2013.01); *B65G 2201/02* (2013.01); *H05K 7/1488* (2013.01)

(56) References Cited

U.S. PATENT DOCUMENTS

| | | | | |
|---|---|---|---|---|
| 3,999,823 A * | 12/1976 | Di Liddo | ............. | B65G 1/0435 312/268 |
| 4,007,846 A * | 2/1977 | Pipes | ............. | B65G 1/0435 414/807 |
| 4,405,277 A | 9/1983 | Bürkner et al. | | |
| 4,690,602 A * | 9/1987 | Castaldi | ............. | B65G 1/0435 414/280 |
| 5,043,962 A * | 8/1991 | Wanger | ............. | G11B 17/041 369/195 |
| 5,328,316 A * | 7/1994 | Hoffmann | ............. | B65G 1/0435 187/404 |
| 5,361,481 A | 11/1994 | Lloyd et al. | | |
| 5,564,880 A * | 10/1996 | Lederer | ............. | B65G 1/0435 414/280 |
| 5,805,561 A * | 9/1998 | Pollard | ............. | G11B 17/225 360/92.1 |
| 5,848,872 A * | 12/1998 | Manes | ............. | G11B 15/6835 414/753.1 |
| 6,042,322 A * | 3/2000 | Piccini | ............. | B65G 1/0407 414/281 |
| 6,198,593 B1 * | 3/2001 | Hori | ............. | G11B 15/6835 360/92.1 |
| 6,512,653 B1 * | 1/2003 | Sasaki | ............. | G11B 15/6835 360/92.1 |
| 7,106,538 B2 * | 9/2006 | Minemura | ............. | G11B 15/68 360/71 |
| 7,307,924 B2 * | 12/2007 | Schmidtke | ............. | G11B 15/68 369/30.3 |
| 7,360,982 B2 * | 4/2008 | Hiraguchi | ............. | G11B 15/68 360/94 |
| 7,387,485 B2 * | 6/2008 | Dickey | ............. | G11B 15/6835 360/92.1 |
| 7,483,344 B2 * | 1/2009 | Collins | ............. | G11B 15/6835 360/92.1 |
| 7,731,474 B2 * | 6/2010 | Hiroyasu | ............. | G11B 15/6825 369/30.43 |
| 7,753,638 B2 * | 7/2010 | Ishiyama | ............. | G11B 17/225 414/277 |
| 7,764,461 B2 * | 7/2010 | Minemura | ............. | G11B 15/68 360/92.1 |
| 8,514,513 B2 * | 8/2013 | Hori | ............. | G11B 17/225 360/92.1 |
| 9,218,842 B2 * | 12/2015 | Ishiyama | ............. | G11B 15/689 |
| 9,731,949 B2 * | 8/2017 | Koyama | ............. | B66F 9/07 |
| 9,802,801 B2 * | 10/2017 | Koyama | ............. | B65G 1/0407 |
| 10,096,336 B2 * | 10/2018 | Macias | ............. | G11B 15/6835 |
| 10,179,698 B2 * | 1/2019 | Torazawa | ............. | B65G 1/0435 |
| 10,280,001 B2 * | 5/2019 | Oki | ............. | B65G 1/0407 |
| 10,322,875 B2 * | 6/2019 | De Vries | ............. | B65G 1/06 |
| 2003/0091411 A1 * | 5/2003 | Diehm | ............. | B65G 1/0435 414/280 |
| 2004/0091339 A1 * | 5/2004 | Arnal | ............. | G11B 15/6835 414/280 |
| 2006/0023335 A1 | 2/2006 | Minemura et al. | | |
| 2006/0099055 A1 * | 5/2006 | Stefani | ............. | B65G 1/0435 414/277 |
| 2007/0135961 A1 * | 6/2007 | Ishida | ............. | B65G 1/0435 700/213 |
| 2007/0144991 A1 * | 6/2007 | Hansl | ............. | B65G 1/0407 211/121 |
| 2008/0265500 A1 | 10/2008 | Katsuyama | | |
| 2010/0268374 A1 * | 10/2010 | Jung | ............. | H01L 21/67769 700/218 |
| 2012/0093619 A1 * | 4/2012 | Wei | ............. | G11B 15/68 414/267 |
| 2015/0023772 A1 * | 1/2015 | Beer | ............. | B65G 17/323 414/751.1 |

FOREIGN PATENT DOCUMENTS

| | | |
|---|---|---|
| JP | 5831801 A | 2/1983 |
| JP | 1187112 A | 7/1989 |
| JP | 3228540 A | 10/1991 |
| JP | 2008266005 A | 11/2008 |

* cited by examiner

ARTICLE TRANSPORT APPARATUS

CROSS-REFERENCE TO RELATED APPLICATIONS

This application is the United States national phase of International Application No. PCT/JP2017/005463 filed Feb. 15, 2017, and claims priority to Japanese Patent Application No. 2016-029209 filed Feb. 18, 2016, the disclosures of which are hereby incorporated in their entirety by reference.

TECHNICAL FIELD

The present invention relates to an article transport apparatus comprising a movable member having a support portion for supporting an article from below, and first actuators for moving the movable member.

BACKGROUND ART

A conventional example of such an article transport apparatus is described in JP H01-187112 (Patent Document 1). In the article transport apparatus of Patent Document 1, an article is moved between a support portion and a transfer target portion by a transfer mechanism after a movable member is moved to a target stop location by the actuating power of a first actuator. To describe the transfer mechanism further, the transfer mechanism has hooks which engage an article along a front-and-back direction, guide rails which guide the hooks along the front-and-back direction, and a reversible motor for moving the hooks along the front-and-back direction, and is configured to move an article between the support portion and a transfer target portion by moving the hooks along the front-and-back direction with the reversible motor.

PRIOR ART DOCUMENTS

Patent Documents

Patent Document 1: JP H01-187112

SUMMARY OF THE INVENTION

Problems to be Solved by the Invention

In the article transport apparatus described above, the guide rails are located below the support portion, and the reversible motor is so located that it projects downward to a location below the support portion. In other words, the guide rails and the reversible motor are located below the support portion. Thus, a portion of a movable member that is located below the support portion is large in size along a vertical direction; thus, when lowering the movable member, it was not possible to lower the article supported by the support portion to a sufficiently low height. Thus, it was difficult to provide a transfer target portion at a low location.

The article transport apparatus is desired which can transfer an article to a transfer target portions at a low height. Means for Solving the Problems An article transport apparatus in accordance with the present disclosure comprises: a movable member having a support portion for supporting an article from below; and first actuators for moving the movable member, characterized in that the movable member includes a transfer mechanism for moving an article between the support portion and a transfer target portion, to or from which the article is to be transferred, with the support portion and transfer target portion in alignment with each other, wherein, with a target stop location being a location at which the movable member is stopped when moving an article between the support portion and the transfer target portion with the transfer mechanism, with a front-and-back direction being a direction along which the movable member and the transfer target portion are spaced apart from each other as seen along the vertical direction when the movable member is located at the target stop location, and with a lateral direction being a direction that crosses the front-and-back direction as seen along the vertical direction, the transfer mechanism includes an interlocking portion capable of being interlocked with an article along the front-and-back direction, a first guide portion for guiding the interlocking portion along the front-and-back direction, and a second actuator for moving the interlocking portion along the front-and-back direction, wherein the transfer mechanism moves an article between the support portion and the transfer target portion by moving the interlocking portion along the front-and-back direction by means of the second actuator with the movable member located at the target stop location, and wherein the first guide portion and the second actuator are so located to be higher than an article supported by the support portion.

With such an arrangement, an article, with which the interlocking portion is interlocked, is moved between the support portion and the transfer target portion by moving the interlocking portion along the front-and-back direction by means of the second actuator with the movable member located at the target stop location.

And the first guide portion for guiding the interlocking portion along the front-and-back direction and the second actuator for moving the interlocking portion along the front-and-back direction are located higher than an article supported by the support portion. Thus, it is not necessary to locate either the first guide portion or the second actuator lower than the support portion. Thus a portion of the movable member that is located lower than the support portion can be made smaller in size along the vertical direction. Accordingly, the movable member can be arranged, or can be lowered further, such that the support portion can be located at a lower height, compared with a case where the first guide portion and the second actuator are located lower than the support portion, which makes it possible to transfer an article to and from a transfer target portion at a low height.

BRIEF DESCRIPTION OF THE DRAWINGS

FIG. 5 is a front view of the lock mechanism.

MODES FOR CARRYING OUT THE INVENTION

Embodiments of an article transport facility provided with an article transport apparatus in accordance with the present invention are described with reference to the drawings.

Figure 1:
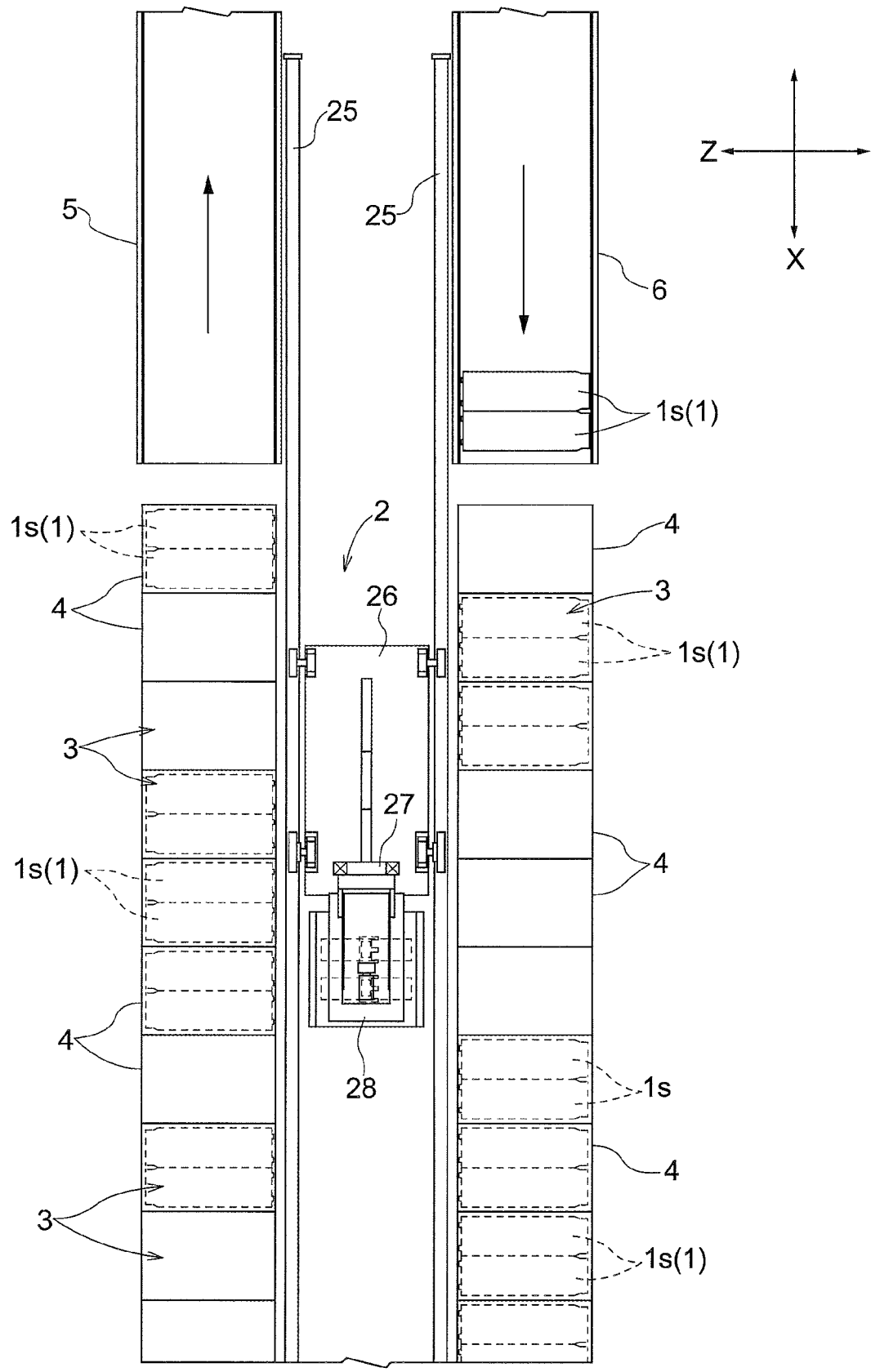
FIG. 1 is a plan view of an article transport facility.

As shown in FIG. 1, an article transport facility includes a stacker crane 2 as an article transport apparatus for transporting an article 1, storage racks 4 in which storage portions 3 for storing articles 1 are arranged one above another along the vertical direction Y, and a carry-out conveyor 5, and a carry-in conveyor 6. A plurality of storage racks 4 are arranged one adjacent to another along a lateral direction X. And the stacker crane 2 moves along the storage racks 4 arranged one adjacent to another and along the lateral direction X.

Figure 2:
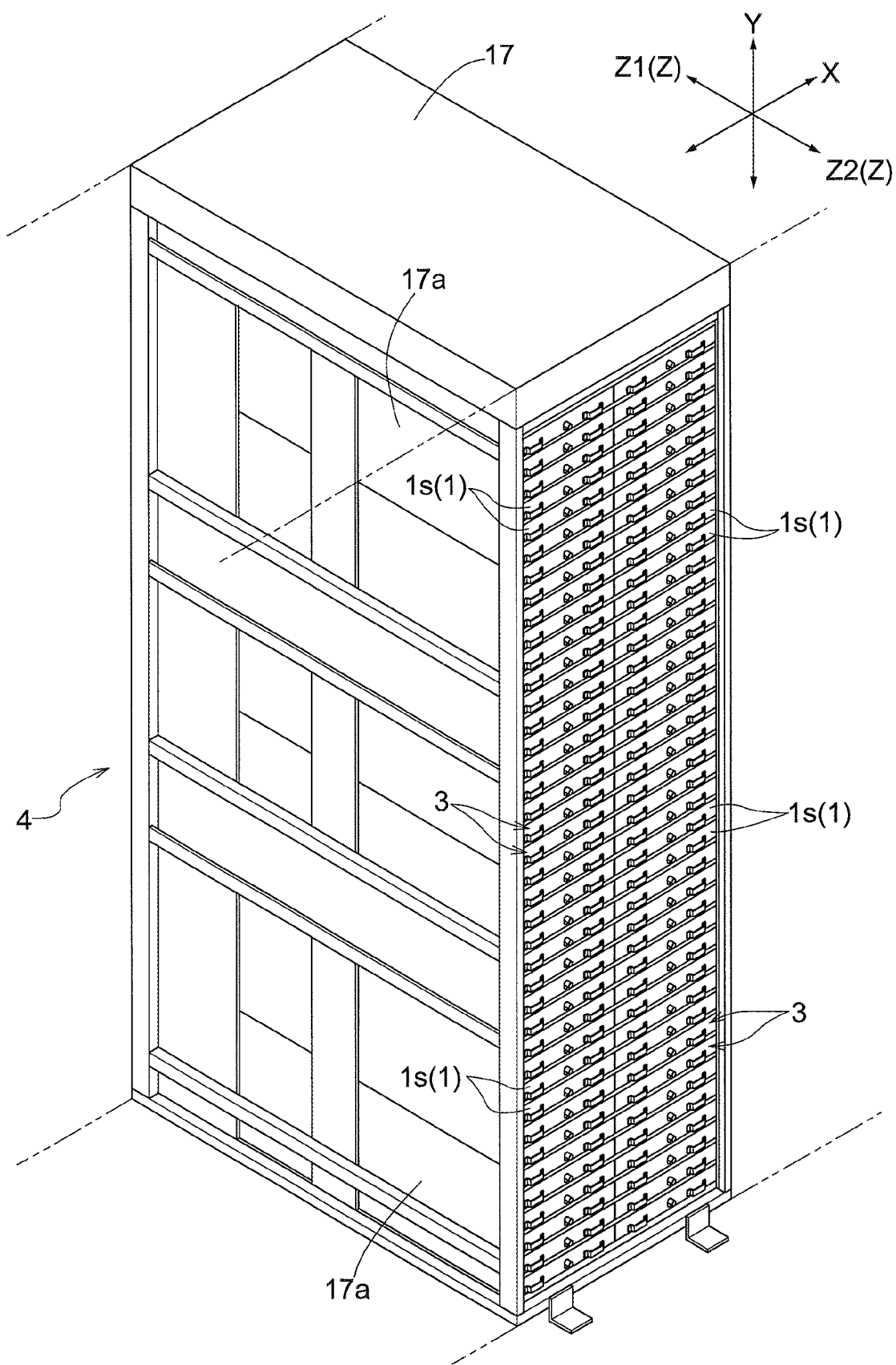
FIG. 2 is a perspective view of a storage rack as seen from a position forward and above.

Note that, in the following description, the lateral direction X is a direction along which the stacker crane 2 travels as seen along the vertical direction Y, and the front-and-back direction Z is a direction perpendicular to the lateral direction X as seen along the vertical direction Y. In addition, as shown in FIG. 2, along the front-and-back direction Z, the back direction Z1 is the direction in which the storage rack 4 exists with respect to the travel path, and the front direction Z2 is the direction, along the front-and-back direction Z, that is opposite from the back direction.

In the present embodiment, occupied storage racks 4 which already have articles 1 stored in them are installed in the article transport facility. And when a malfunction, etc., occurs in an article 1 stored in a storage rack 4 and it needs to be replaced, the article 1 to be replaced is retrieved from the storage portion 3 and is transported to the carry-out conveyor 5 by the stacker crane 2. And a new article 1 carried in by the carry-in conveyor 6 is transported by the stacker crane 2 to the storage portion 3 (the storage portion 3 from which the article 1 being replaced was retrieved).

[Articles]

In the present embodiment, the servers 1s, as articles 1, are stored in the storage racks 4 and are transported by the stacker crane 2. In addition, in the article transport facility, as articles 1, there are dummy articles 1d (see, for example, FIG. 18) whose shapes, as seen along a vertical direction Y, are formed in the same shape as the shape of the servers 1s. Note that, in the present embodiment, although there are cases where two servers 1s are transported together by the stacker crane 2 as well as cases where a server 1s and a dummy article 1d are transported together, the servers 1s are stored in storage portions 3 whereas no dummy articles 1d are stored in storage portions 3.

The servers 1s are described next. In the following description, the front-and-back direction Z and the lateral direction X of a server 1s are defined based on the attitude of the server 1s when stored in a storage portion 3.

As shown in FIG. 2, each server 1s is formed such that its width along the front-and-back direction Z is greater than the width along the lateral direction X, and each server 1s is stored in a storage rack 4 in an attitude in which its longer side extends along the front-and-back direction.

Figure 3:
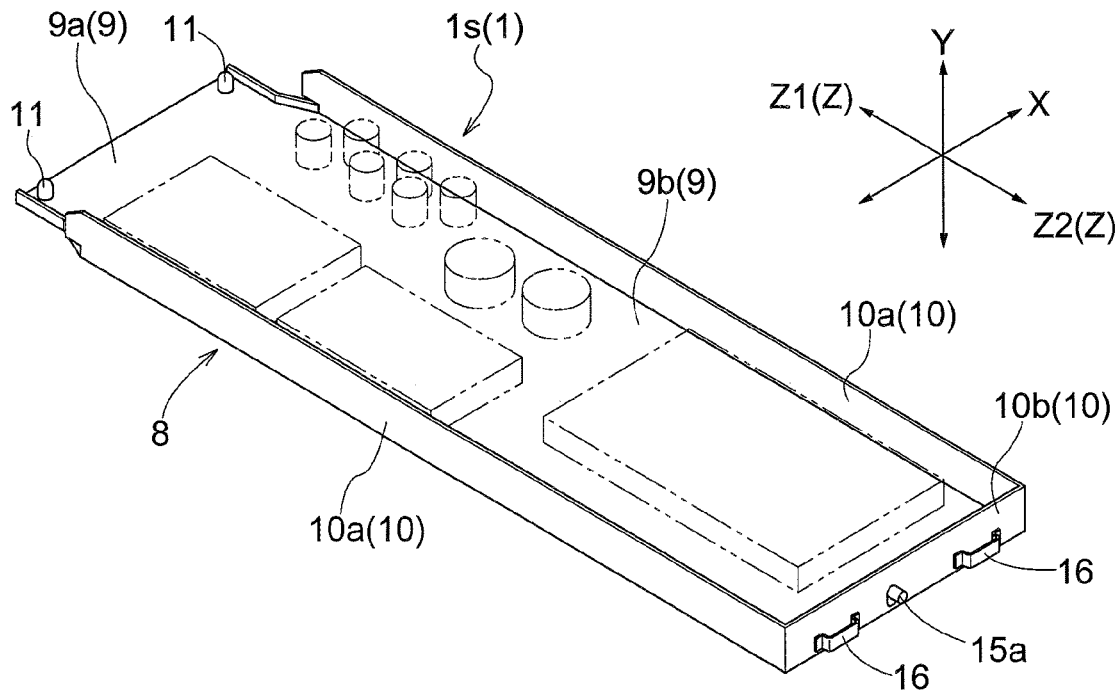
FIG. 3 is a perspective view of a server as seen from a position diagonally above.
Figure 4:
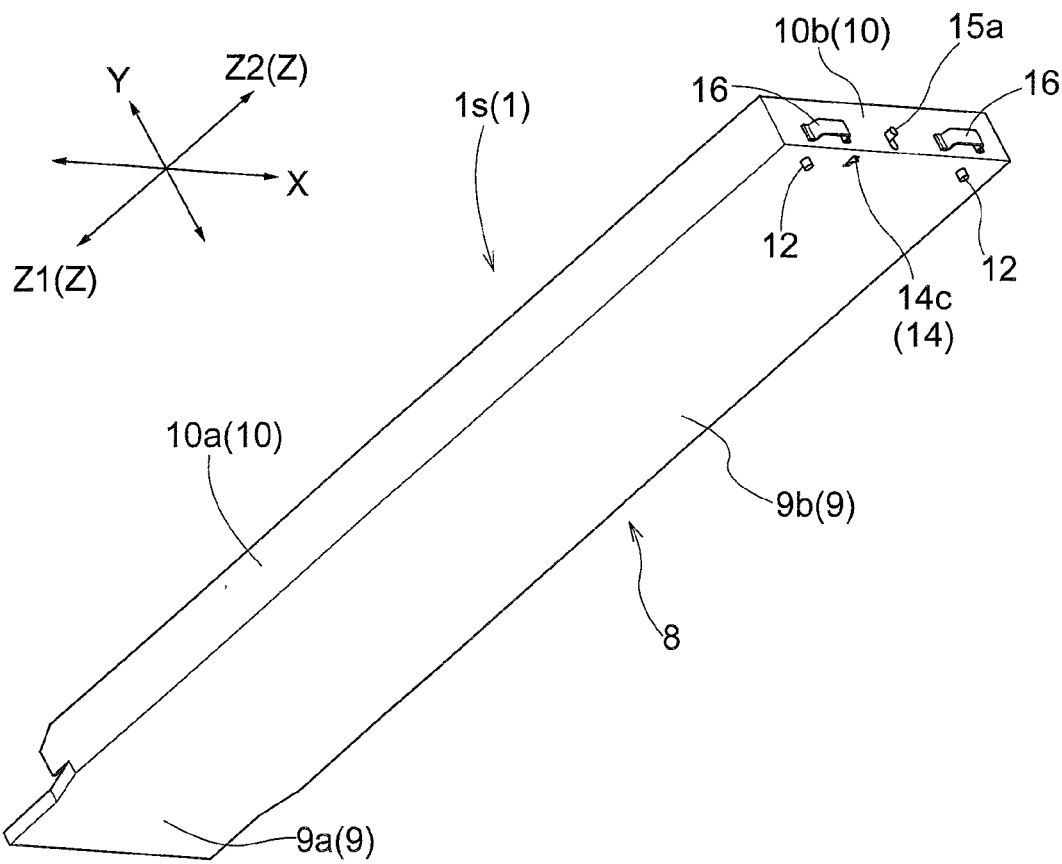
FIG. 4 is a perspective view of the server seen from a position diagonally below.

As shown in FIGS. 3 and 4, a servers 1s has a housing 8 and a substrate (not shown) on which CPU, memory, hard disks, etc. are mounted. The housing 8 is formed to have a bottom face portion 9 and wall portions 10 arranged to extend vertically from the bottom face portion 9. The housing 8 is formed in a box shape whose upper area and back area are open. The substrate is fixed on the bottom face portion 9.

The bottom face portion 9 consists of a back end portion 9a provided at a location in the back direction Z1, and a front portion 9b provided at a location in the front direction Z2 with respect to this back end portion 9a.

The front portion 9b is formed in a rectangular shape as seen along the vertical direction Y. The back end portion 9a has a rectangle portion formed in a rectangular shape having a width along the lateral direction X that is narrower than the front portion 9b, and a tapered portion which is located between this rectangle portion and the front portion 9b and whose width along the lateral direction X is gradually narrower toward its back direction Z1 side end. With the back end portion 9a so formed, the width of the article 1 along the lateral direction X is so formed to be gradually narrower toward the back direction Z1 side end.

Although a portion of the back end portion 9a is formed in a tapered shape in the present embodiment, the entire back end portions 9a may have a tapered shape.

As the wall portions 10, there are provided lateral wall portions 10a which are located at end portions along the lateral direction X and extend along the front-and-back direction, and a front wall portion 10b which is located at a front direction Z2 side end portion and extends along the lateral direction X.

Each server 1s is provided with bar-shaped first engaging portions 11 and second engaging portions 12 both for positioning, a lock mechanism 13 (see FIG. 5), and interlocked portions 16. As shown in FIG. 3, the first engaging portions 11 are located in the back direction Z1 side end portion of the article 1 such that they project upward from the bottom face portion 9. As shown in FIG. 4, the second engaging portions 12 are located in the front direction Z2 side end portion of each article 1 such that they project downward from the bottom face portion 9. The interlocked portions 16 are located on the front face of the front wall portion 10b of the article 1, and are generally formed in a shape of a "U" as seen along the vertical direction Y. The interlocked portions 16 are so configured to allow an interlocking portion 37 of a transfer mechanism 32 described below to be interlocked with the interlocked portions 16 by being inserted from above into the space between the interlocked portions 16 and the front wall portion 10b. In addition, an interlocked portion 16 is located in a portion of the front wall portion 10b of the article 1 that is located to one side of a center along the lateral direction X and an interlocked portion 16 is located in a portion on the other side. An article 1 is provided with a pair of interlocked portions 16 that are so located to be spaced apart from each other along the lateral direction X.

Figure 5:
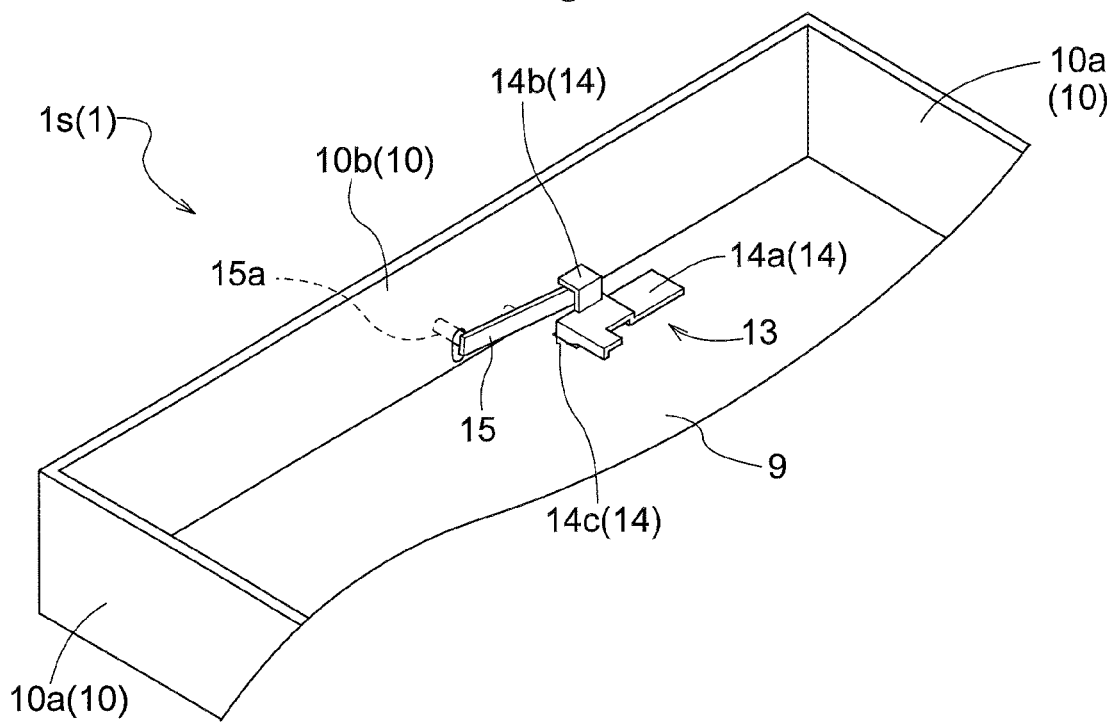
FIG. 5 is a perspective view of a lock mechanism.
Figure 6:
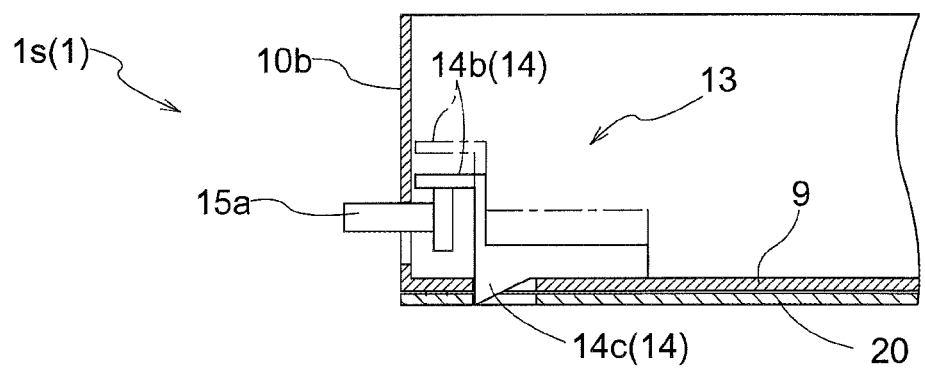
FIG. 6 is a side view of the lock mechanism.
Figure 7:
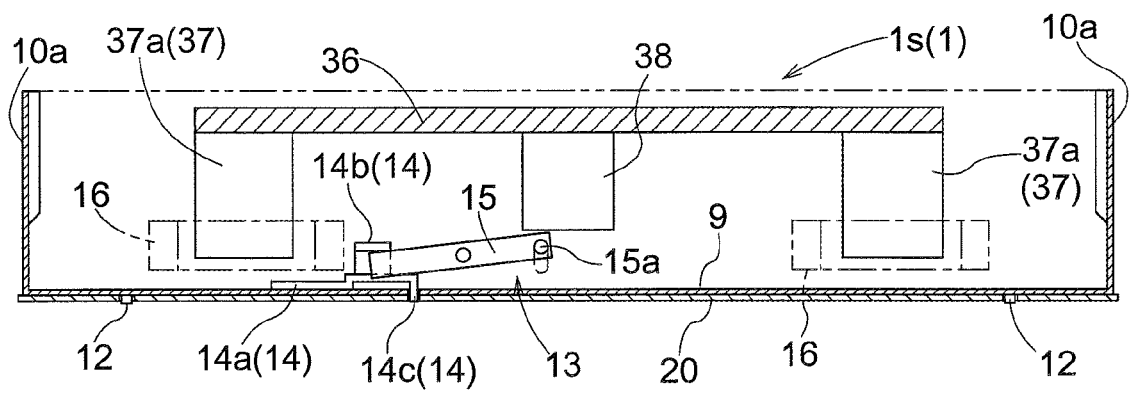

As shown in FIGS. 5 through 7, the lock mechanism 13 is located in the front direction Z2 side end portion of the article 1.

The lock mechanism 13 consists of an engaging member 14 which consists of a leaf spring, and a swing member 15 swingable about an axis extending along the front-and-back direction Z.

The engaging member 14 has a fixed portion 14a fixed to the top surface of the bottom face portion 9, a contact portion 14b which can be operated to be moved upward by the swing member 15, and a third engaging portion 14c which projects downward from a hole that extends through the bottom face portion 9 along the vertical direction Y. The swing member 15 is connected to the front wall portion 10b such that its intermediate portion along a direction it extends is swingable about an axis extending along the front-and-back direction Z. And one end portion of the swing member 15 along the direction it extends projects from a hole which extends through the front wall portion 10b along the front-and-back direction Z. The portion of the swing member 15 that projects from the front wall portion 10b is configured as an operated portion 15a. This operated portion 15a projects from a central portion, along the lateral direction X, of the front wall portion 10b.

As shown in FIGS. 5-7, when the operated portion 15a is not operated or acted on, the lock mechanism 13 is in a locking state in which the third engaging portion 14c projects downward from the bottom face portion 9. And in the lock mechanism 13, the other end portion of the swing member 15 along the direction it extends pushes the contact portion 14b upward from the state shown in FIG. 7, as an operating portion 38 is moved downward and presses the operated portion 15a downward. This causes the lock mechanism 13 to be switched to a lock release state in which the third engaging portion 14c does not project downward from the bottom face portion 9. In addition, the lock mechanism 13 is switched from the lock release state to the locking state by the resilience of the leaf springs, as the operated portion 15a is released from being pressed.

[Storage Racks]

Each storage rack 4 consists of rack forming body 17 and shelves 20. The rack forming body 17 consist of a base frame which is a framework formed by frame members, and flat and thin plate members. And a plurality of storage portions 3 arranged one above another along the vertical direction Y are formed in a storage rack 4 by dividing the storage space formed in the rack forming body 17 into a plurality of spaces arranged one above another along the vertical direction Y by means of a plurality of shelves 20.

Incidentally, the storage portion 3 at the highest level is formed between a portion of the rack forming member 17 that covers the top of the storage space and the shelf 20 that is at the highest location among the plurality of shelves 20. In addition, the storage portion 3 at the lowest level is formed between a portion of the rack forming member 17 that covers the bottom of the storage space and the shelf 20 that is at the lowest location among the plurality of shelves 20.

Figure 8:
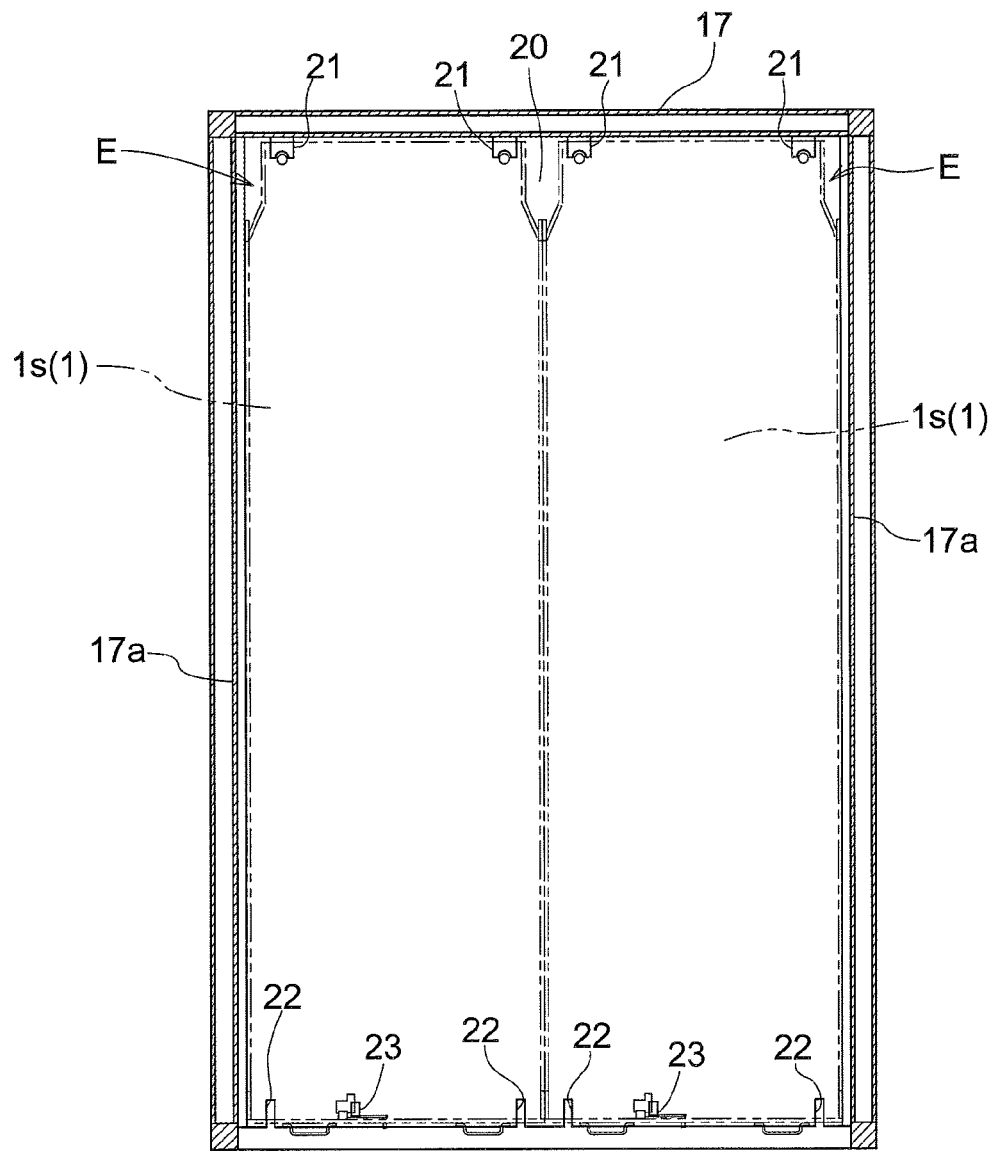
FIG. 8 is a plan view of a storage portion.

As shown in FIG. 8, each of the plurality of storage portions 3 provided to a storage rack 4 includes a plurality of storage areas E that are adjacent to each other along the lateral direction X, and is configured to be capable of storing a plurality of articles 1 with the articles arranged adjacent each other along the lateral direction X.

More specifically, the distance between two side walls 17a which cover both lateral sides of the storage space in the rack forming member 17 is greater, by about a few millimeters, than twice the lateral width of an article 1 (width of the front portion 9b along the lateral direction X).

In addition, the distance, along the vertical direction Y, between two shelves 20 that are adjacent to each other along the vertical direction Y is greater, by a few millimeters, than a portion of an article 1 that has the greatest vertical width. Each article 1 is stored with its bottom surface supported from below by the top surface of a shelf 20.

Each of a plurality of storage portions 3 is capable of storing a pair of articles 2 in the pair of storage areas E that are adjacent to each other along the lateral direction X with the articles arranged adjacent to each other along the lateral direction X. In addition, the pair of side walls 17a function as second guide members 24 for contacting the articles 1 from lateral directions X to guide the articles 1 along the front-and-back direction Z when moving the articles 1 with the transfer mechanism 32 described below.

And the second guide members 24 are provided at locations in the back direction Z1 (on the storage portion 3 side) with respect to guide members 33 provided to the vertically movable member 28 when the vertically movable member 28 is located at a target stop location. And the second guide members 24 are provided only on both outboard sides along the lateral direction X of a second article group which consists of the two articles 1 stored in a storage portion 3.

Note that a target stop location of the vertically movable member 28 is a location at which the vertically movable member 28 is stopped when moving an article 1 between the support portion 31 and a storage area E of a storage portion 3. In addition, when the vertically movable member 28 is located at a target stop location, the vertically movable member 28 and storage areas E are aligned with, and spaced apart from, each other along the front-and-back direction Z.

First engaged portions 21 are provided in the back direction Z1 side end portion of a shelf 20. When an article 1 is stored in a storage area E of a storage portion 3, the first engaging portions 11 of the article 1 engage the first engaged portions 21. In addition, second engaged portions 22 are provided in the front direction Z2 side end portion of the shelf 20. When an article 1 is stored in a storage area E of a storage portion 3, the second engaging portions 12 of the article 1 engage the second engaged portions 22.

Third engaged portions 23 are provided in the front direction Z2 side end portion of the shelf 20. The third engaging portion 14c of the lock mechanism 13 engages the third engaged portion 23 by switching the lock mechanism 13 of the article 1 to the locking state with the article 1 stored in a storage area E of a storage portion 3.

Note that the portion of the rack forming member 17 that covers the bottom of the storage space is provided with the first engaged portions 21, the second engaged portions 22, and the third engaged portions 23 as with a shelf 20.

The storage racks 4 are installed on both sides, along the front-and-back direction Z, of the travel path of the stacker crane 2. The storage areas E are located on the both sides, along the front-and-back direction Z, of the movable member stopped at a target stop location. The storage areas E correspond to transfer target portions.

[Stacker Crane]

Figure 9:
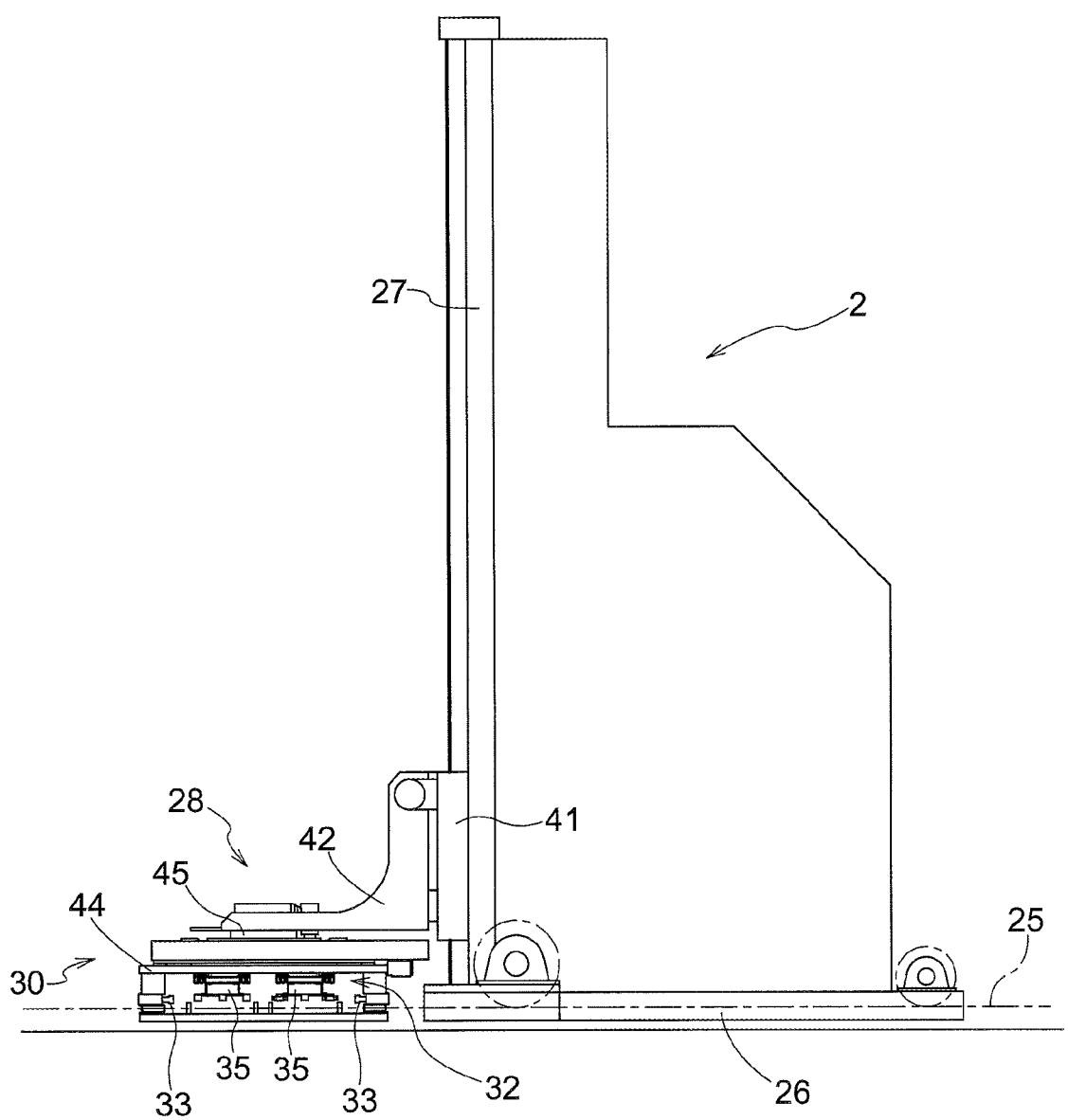
FIG. 9 is a side view of a stacker crane.
Figure 10:
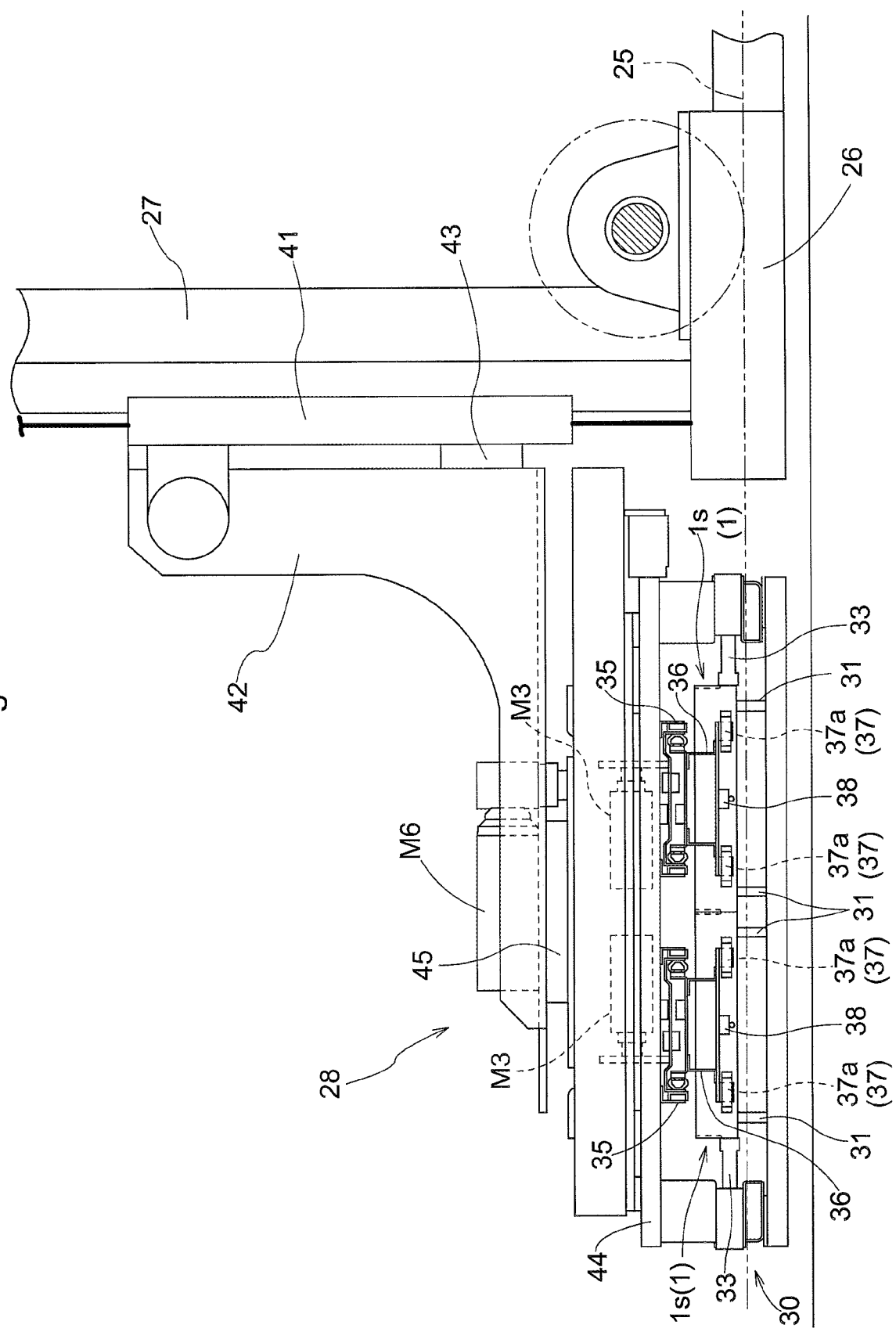
FIG. 10 is a side view of a vertically movable member.
Figure 13:
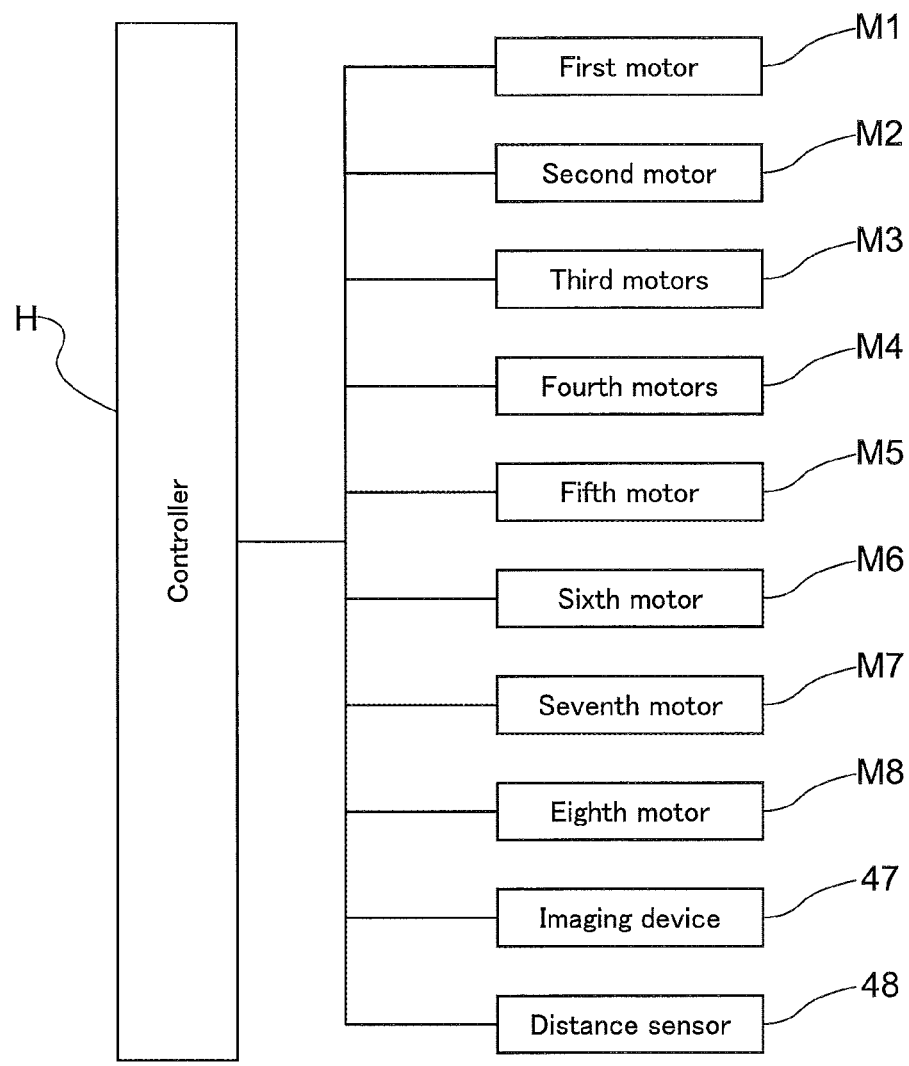
FIG. 13 is a control block diagram.

As shown in FIGS. 1, 9, and 10, the stacker crane 2 has a vertically movable member 28 having a support portion 31 for supporting articles 1 from below, a first motor M1 (see FIG. 13) as a travel actuator for moving the vertically movable member 28, and a second motor M2 (see FIG. 13) as a vertical movement actuator.

To describe this further, the stacker crane 2 has a travel carriage 26 as a travel portion which travels along the travel path, a support column 27 as a second guide portion arranged vertically on the travel carriage 26, the vertically movable member 28 which is moved along the support column 27 and thus along the vertical direction Y, the first motor M1 for causing the travel carriage 26 to travel, and the second motor M2 for moving the vertically movable member 28 along the support column 27 and thus along the vertical direction Y. The vertically movable member 28 is moved along the lateral direction X as a result of the fact that the travel carriage 26 travels under the actuating power of the first motor M1. The vertically movable member 28 is moved along the vertical direction Y by the actuating power of the second motor M2.

Thus, the vertically movable member 28 is configured to be moved along the lateral direction X and the vertical direction Y by the actuating power of the first motor M1 and the second motor M2. This vertically movable member 28 corresponds to the movable member which is moved along the vertical direction Y and the lateral direction X. In addition, the first motor M1 and the second motor M2 correspond to the first actuators for moving the movable member.

The travel carriage 26 travels on a pair of guide rails 25 along the lateral direction X. The pair of guide rails 25 are so located that they extend along the lateral direction X and are spaced apart from each other along the front-and-back direction Z. The support column 27 is arranged vertically on the travel carriage 26 to guide the vertically movable member 28 along the vertical direction Y.

Figure 11:
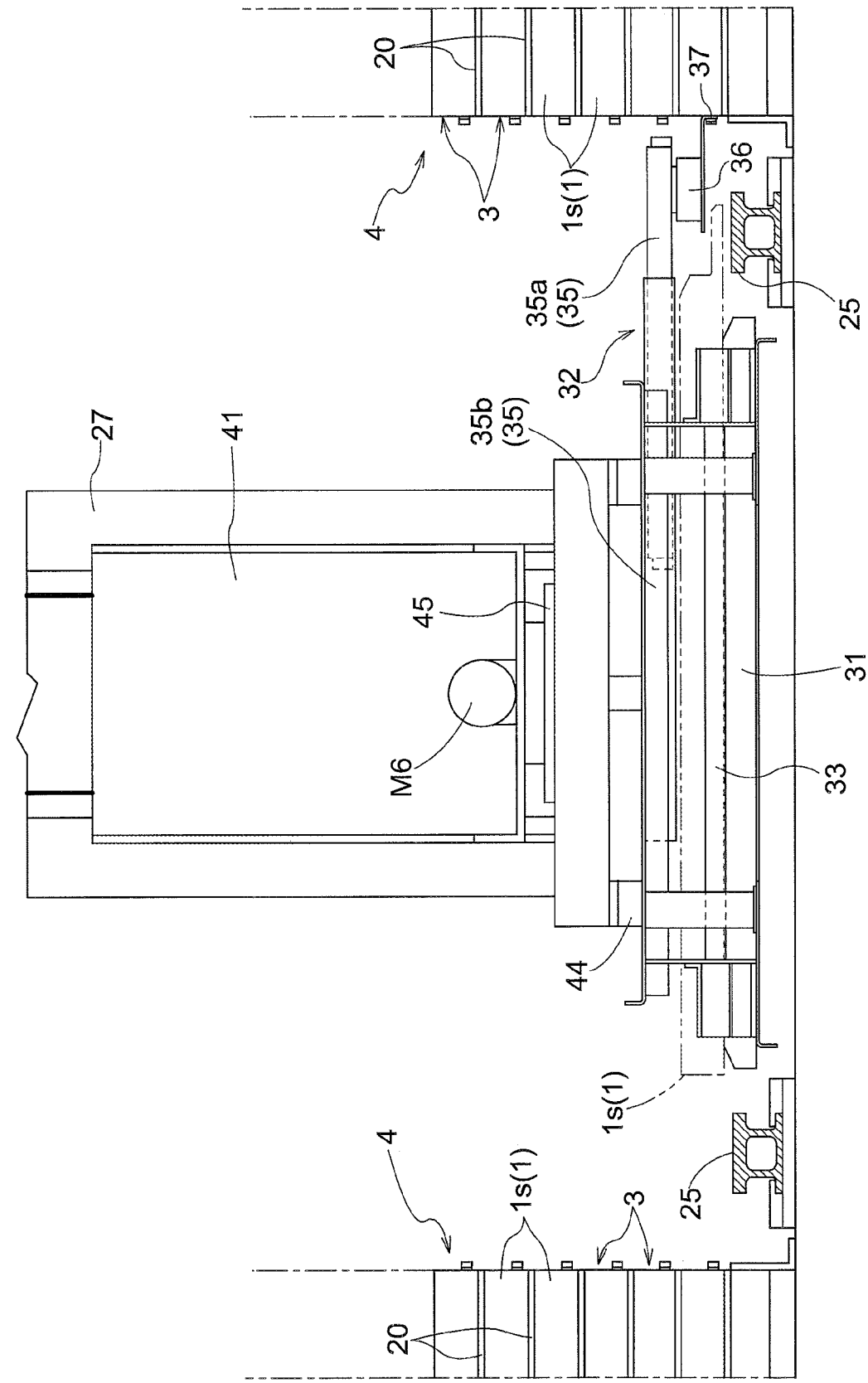
FIG. 11 is a front view of a vertically movable member.
Figure 12:
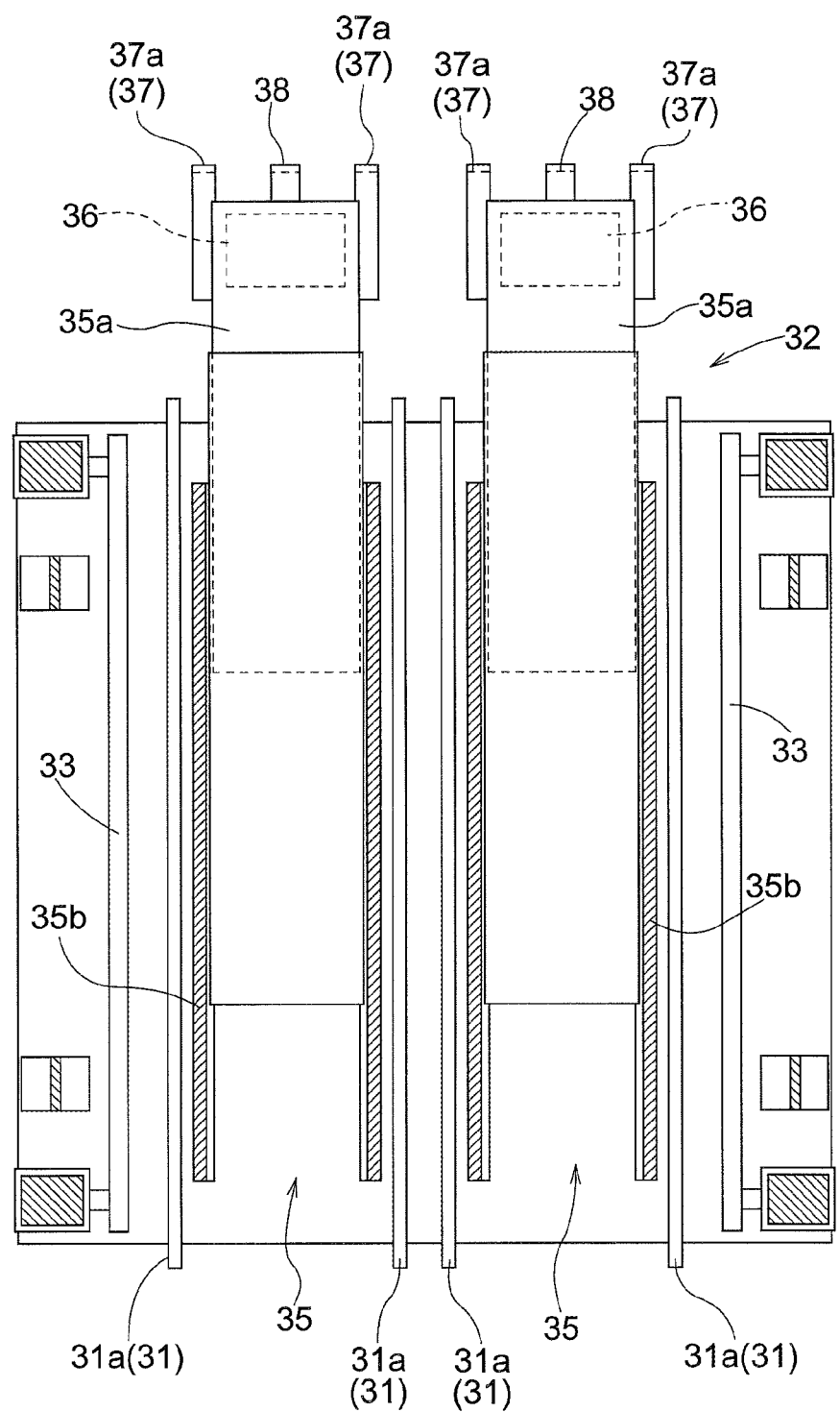
FIG. 12 is a plan view of an article transfer device.

As shown in FIGS. 10-12, the vertically movable member 28 includes a support portion 31, a transfer mechanism 32, and the guide members 33.

The support portion 31 consists of two pairs of support members 31a with the support members 31a in each pair being spaced apart from each other along the lateral direction X and with the two pairs being space apart from each other along the lateral direction X. Each pair of support members 31a is configured to support one article 1 from below. In other words, as a result of the support portion 31 consisting of two pairs of support members 31a that are space apart from each other along the lateral direction X, it can support two articles 1 with the articles 1 located adjacent to each other along the lateral direction X. A plurality of articles 1 that are supported by this support portion 31 are referred to as a first article group. In addition, two articles 1 that are supported by a shelf 20 of a storage rack 4 are referred to as a second article group. Each of a first article group and a second article groups consists of two articles 1 that are adjacent to each other along the lateral direction X.

The transfer mechanism 32 moves an article 1 between the support portion 31 and a transfer target portion, to or from which the article 1 is to be transferred, with the support portion 31 and the transfer target portion in alignment with, and spaced part from, each other along the front-and-back direction Z. The transfer mechanism 32 has fork mechanisms 35 which can be projected and retracted along the front-and-back direction Z, slide members 36 supported by primary forks 35a of the fork mechanisms 35 for movement along the front-and-back direction Z, interlocking portions 37 supported by the slide members 36 capable of being interlocked with articles 1 along the front-and-back direction Z, and operating portions 38 supported by the slide members 36 for switching the lock mechanisms 13 of the articles 1 from the locking state to the lock release state. In addition, the transfer mechanism 32 has third motors M3 as the projecting and retracting actuators for projecting and retracting the fork mechanisms 35, movement coupling mechanisms (not shown) which move the slide members 36 along the front-and-back direction Z when the fork mechanisms 35 are projected and retracted, and fourth motors M4 for moving the interlocking portions 37 and the operating portions 38 along the vertical direction Y by moving the fork mechanisms 35 along the vertical direction Y with respect to the support portion 31.

As such, the transfer mechanism 32 has the interlocking portions 37 and the fork mechanisms 35. A fork mechanism 35 (more specifically, a primary fork 35a and a fork base portion 35b) corresponds to the first guide portion for guiding an interlocking portion 37 along the front-and-back direction Z whereas a third motor M3 corresponds to the second actuator for moving an interlocking portion 37 along the front-and-back direction Z. And the transfer mechanism 32 moves an article 1 between the support portion 31 and a transfer target portion by moving an interlocking portion 37 along the front-and-back direction Z with a third motor M3 with the vertically movable member 28 located at a target stop location. A interlocking portion 37 consists of a pair of interlocking members 37a. The interlocking members 37a of this pair are simultaneously interlocked with a pair of interlocked portions 16 provided to an article 1. A interlocking portion 37 (each of the interlocking members 37a of a pair) is formed to be generally flat and thin which extends along the vertical direction Y and along the front-and-back direction Z. The operating portion 38 is formed to be generally flat and thin which extends along the vertical direction Y and along the front-and-back direction Z, as is an interlocking portion 37. This operating portion 38 is provided between the pair of interlocking portions 37 along the lateral direction X.

Each primary fork 35a is moved along the front-and-back direction Z with respect to the fork base portion 35b by the actuating power of the third motor M3. This causes a fork mechanism 35 to be projected and retracted along the front-and-back direction Z. In addition, the arrangements are made such that, when the fork mechanism 35 is projected and retracted, the slide member 36 is moved to the back direction Z1 end portion of the primary fork 35a as the primary fork 35a is projected in the back direction Z1 and such that the slide member 36 is moved to the front direction Z2 end portion of the primary fork 35a as the primary fork 35a is retracted in the front direction Z2.

Each fork mechanism 35 is moved along the vertical direction Y with respect to the support portion 31 by the actuating power of a fourth motor M4. By this movement of the fork mechanism 35 along the vertical direction Y, the interlocking portion 37 is moved to a first height at which the interlocking portion 37 is interlocked with the interlocked portions 16 of an article 1, and to a second height at which the interlocking portion 37 is released from the interlocked portion 16 and is retracted upward from the interlocked portion 16. Note that a fourth motor M4 corresponds to the third actuator for moving an interlocking portion 37 to the first height and to the second height.

The transfer mechanism 32 moves an article 1 between the support portion 31 and a storage area E of a storage portion 3 as a result of the interlocking portion 37 being moved along the front-and-back direction Z by the third motor M3, with the vertically movable member 28 at rest at a target stop location.

To describe this further, when moving an article 1 from a storage area E of a storage portion 3 to the support portion 31, the transfer mechanism 32 projects a fork mechanism 35 in the back direction Z1 from a retracted state with the vertically movable member 28 at rest at a target stop location and with the interlocking portion 37 raised to the second height, to position the interlocking portion 37 between the interlocked portions 16 and the front wall portion 10b of the article 1 along the front-and-back direction Z. Subsequently, the transfer mechanism 32 lowers the fork mechanism 35 to lower the interlocking portion 37 to the first height to cause the interlocking portion 37 to be interlocked with the article 1, then retracts the fork mechanism 35 to the retracted state. By lowering the fork mechanism 35, the operated portion 15a is pushed downward by the operating portion 38, which switches the lock mechanism 13 from the locking state to the lock release state. Subsequently, the interlocking portion 37 is moved in the front direction Z2 so that the interlocked portions 16 of the article 1 is pulled by the interlocking portion 37, as a result of which the article 1 is moved in the back direction Z1. Thus, the article 1 is moved from the storage area E of the storage portion 3 to the support portion 31.

In addition, when moving an article 1 from the support portion 31 to a storage area E of a storage portion 3, the transfer mechanism 32 projects the fork mechanism 35 in the back direction Z1 from the retracted state with the vertically movable member 28 at rest at a target stop location and with the interlocking portion 37 interlocked with the article 1 supported by the support portion 31. This causes the interlocking portion 37 to push the front wall portion 10b of the article 1 and causes the article 1 to be moved in the back direction Z1, which results in the article 1 being moved from the support portion 31 to the storage area E of the storage portion 3. Subsequently, the fork mechanism 35 is raised to raise the interlocking portion 37 to the second height to release the interlocking portions 37 from the article 1. Then the fork mechanism 35 is retracted to the retracted state. Raising the fork mechanism 35 releases the operated portion 15a from being pushed downward by the operating portion 38, which switches the lock mechanism 13 from the lock release state to the locking state.

The transfer mechanism 32 has the same number of the sets (two sets in the present embodiment) as the number (i.e., two in the present embodiment) of articles 1 in a first article group with each set consisting of a fork mechanism 35, a slide member 36, interlocking portion 37, and the operating portion 38. The transfer mechanism 32 has a pair of interlocking portions 37 one for each of the two articles 1 in the first article group.

The transfer mechanism 32 can move two articles 1 supported by the support portion 31 to storage areas E of a storage portion 3 at once by moving the pair of interlocking portions 37 together by means of the third motors M3. When moving two articles, that are adjacent to each other along the lateral direction X, from the support portion 31 to the storage areas E of a storage portion 3 with the transfer mechanism 32, the two articles 1 are guided so as not to deviate along the lateral direction X by a pair of guide members 33.

In addition, the transfer mechanism 32 can move one of the two articles 1 supported by the support portion 31 (i.e., only one of the articles 1 of a first article group) to a storage area E of a storage portion 3 by moving one of the interlocking portions 37 of a pair with a third motor M3. When moving one article 1 from the support portion 31, to a storage area E of a storage portion 3 with the transfer mechanism 32, this one article being transferred 1 is guided so as not to deviate along the lateral direction X by a guide member 33 and another article 1 of the first article group.

To further describe the case where one article 1 is moved, when moving one of the two articles 1 supported by the support portion 31 (only one of the articles 1 of a first article group) to a storage area E of a storage portion 3 as described above, a dummy article 1d is supported by the support portion 31 as the other article 1 in the first article group. In short, in this case, the first article group consists of the server 1s which is the article to be transferred 1, and a dummy article 1d that is not to be transferred.

And with the second side being the side along the lateral direction X on which a dummy article 1d exists with respect to the article to be transferred 1 and with the first side being the side opposite from the second side, when moving the article to be transferred 1 to a storage area E of a storage portion 3 from the support portion 31 with the transfer mechanism 32, the portion, on the first side along the lateral direction X, of this article to be transferred 1 is guided by a guide member 33 whereas the portion, on the second side along the lateral direction X, of the article to be transferred 1 is guided by the dummy article 1d.

In addition, as described above, when moving one of the two articles 1 supported by the support portion 31 (only one of the articles 1 of the first article group) to a storage area E of a storage portion 3, one article 1 in a second article group will be the article soon to be transferred 1 to the storage area E whereas the other article 2 of the second article group is the article 1 already stored in the storage portion 3.

And, with the second side being the side, along the lateral direction X, on which the article that has been already stored is located with respect to the article 1 being transferred and with the first side being the side opposite from the second side, when moving an article 1, that is to be transferred, from the support portion 31 to a storage area E of a storage portion 3 with the transfer mechanism 32, the portion, on the first side along the lateral direction X, of this article being transferred 1 is guided by a side wall 17a whereas the portion, on the second side along the lateral direction X, of this article to being transferred 1 is guided by the article 1 already stored in the storage portion 3.

The vertically movable member 28 includes a pair of guide members 33 for guiding the articles 1 along the front-and-back direction Z when the articles 1 are moved by the transfer mechanism 32, and a fifth motor M5 for changing the distance between the guide members 33 of the pair along the lateral direction X to a first distance, and to a second distance which is a distance along the lateral direction X that is greater than this first distance. The guide members 33 of the pair are provided only at one and the other side, along the lateral direction X, of the first article group respectively. The guide members 33 of the pair are moved in opposite directions along the lateral direction X by the actuating power of the fifth motor M5 to change the distance between the guide members 33 of the pair along the lateral direction X, to the first distance which is slightly (about several millimeters) greater than the lateral width of a first article group and to the second distance which is a distance along the lateral direction X that is larger than this first distance. Note that the second distance can be either a distance between the guide members 33 of the pair after both of them are moved away from each other (see FIG. 17) or, a distance between the guide members 33 of the pair after only one of them is moved away from the other (see FIG. 21). Note that the pair of guide members 33 correspond to the third guide portions for contacting articles 1 from the lateral direction X to guide the articles 1 along the front-and-back direction Z when the transfer mechanism 32 moves articles 1.

The vertically movable member 28 includes a connecting portion 41, a swing portion 42, a swing mechanism 43, a sliding mechanism 44, and a rotating mechanism 45.

A support column 27 is arranged vertically in one side end portion, along the lateral direction X, of the travel carriage 26. The connecting portion 41 is engaged with the support column 27 for movement with respect thereto along the vertical direction Y at a location on one side, along the lateral direction X, of the support column 27. Because the connecting portion 41 is engaged with the support column 27 at a location on one side, along the lateral direction X, of the support column 27, the vertically movable member 28 is located to one side, along the lateral direction X, of the support column 27. The article transfer device 30 including the support portion 31 is so located that it does not overlap with the travel carriage 26 as seen along the vertical direction Y.

The swing portion 42 is generally formed in a shape of an "L" as seen along the front-and-back direction Z. And the upper end of the swing portion 42 is connected to the connecting portion 41 such that the swing portion 42 can be swung about a swing axis that extends along the front-and-back direction Z. In addition, the swing portion 42 supports the support portion 31, the transfer mechanism 32, and the guide members 33 through the sliding mechanism 44 and the rotating mechanism 45.

The swing mechanism 43 is configured to swing the support portion 31, the transfer mechanism 32, and the guide members 33 together as a result of the swing portion 42 being swung about the swing axis with respect to the connecting portion 41 by the actuating power of the eighth motor M8. The support portion 31, the transfer mechanism 32, and the guide members 33 are moved together by the swing mechanism 43, the sliding mechanism 44, and the rotating mechanism 45. In the description below, the support portion 31, the transfer mechanism 32, and the guide members 33, and any members that connect these to one another may be referred to collectively as an article transfer device 30.

The rotating mechanism 45 is supported by the swing portion 42 to be located lower than the swing portion 42, and supports the sliding mechanism 44 such that the sliding mechanism 44 can be rotated about a rotation axis extending along the vertical direction Y. The sliding mechanism 44 supports the article transfer device 30 such that the article transfer device 30 can be moved along the lateral direction X.

The rotating mechanism 45 is configured to rotate the article transfer device 30 supported by the sliding mechanism 44 about the rotation axis as a result of the sliding mechanism 44 being rotated about the rotation axis with respect to the swing portion 42 by the actuating power of the sixth motor M6. Thus, by rotating the article transfer device 30 about the rotation axis, the support portion 31, the transfer mechanism 32, and the guide members 33 are rotated together about the vertical axis. Note that the sixth motor M6 corresponds to the fourth actuator for rotating the transfer mechanism 32 through at least 180 degrees about an axis extending along the vertical direction Y.

The sliding mechanism 44 is configured to move the article transfer device 30 along the lateral direction X with respect to the swing portion 42 by the actuating power of the seventh motor M7. Thus, by moving the article transfer device 30 along the lateral direction X, the support portion 31, the transfer mechanism 32, and the guide members 33 are moved together along the lateral direction X.

The support portion 31 is so located to be between the pair of guide rails 25 along the front-and-back direction Z as shown in FIG. 11, and is so located that the support portion 31 does not overlap with the travel carriage 26 as seen along the vertical direction Y as shown in FIGS. 1 and 10.

In addition, the pair of guide members 33 are located, along the vertical direction Y, between the support portion 31 on the one hand and the fork mechanism 35 and the third motor M3 on the other hand. To describe this further, the upper ends of the pair of guide members 33 are located higher than the top surfaces of the support portion 31 (i.e., surfaces on which articles 1 are placed), and are located lower than the lower ends of the fork mechanism 35 and the third motor M3. The lower ends of the pair of guide members 33 are located between the upper ends and the lower ends of the support portion 31, along the vertical direction Y.

The connecting portion 41, the swing portion 42, the swing mechanism 43, the sliding mechanism 44, the rotating mechanism 45, and the fork mechanism 35 are located higher than the upper ends of the support portion 31, and the upper ends of articles 1 supported by the support portion 31.

The rotating mechanism 45 can change the direction in which an article 1 is moved by the transfer mechanism 32 by rotating the transfer mechanism 32 through 180 degrees with the sixth motor M6. Therefore, even if the storage areas E of the storage portions 3 exist on both sides, along the front-and-back direction Z, of the vertically movable member 28 because storage racks 4 are installed on both sides, along the front-and-back direction Z, of the travel path of the stacker crane 2, the transfer mechanism 32 can transfer an article 1 between any of the storage areas E of storage portions 3 that exist on both sides and the support portion 31.

In addition, the vertically movable member 28 includes an imaging device 47 and a distance sensor 48. The imaging device 47 and the distance sensor 48 are supported by the article transfer device 30 so that they are moved together with the fork mechanism 35 and the support portion 31.

[Controller]

The stacker crane 2 includes a controller H which controls traveling of the travel carriage 26, vertical movements of the vertically movable member 28, and operations of the transfer mechanism 32. This controller H may be mounted on the stacker crane 2 so that it can move with the stacker crane 2 or may be installed on the floor surface F so that it would not move with the stacker crane 2. Note that the controller H corresponds to the controller for controlling the first actuator and the second actuator.

The controller H performs a movement control and transfer controls. In addition, after the controller H completes a movement control, it performs a correction control before starting a transfer control.

A movement control is a control for causing the vertically movable member 28 to be moved to a target stop location. A transfer control is a control for causing one or more articles 1 to be moved or transferred between the support portion 31 and one or more storage areas E of a storage portion 3. A transfer control may be any of a double retrieval control, a double storage control, a single retrieval control, and a single storage control.

Figure 14:
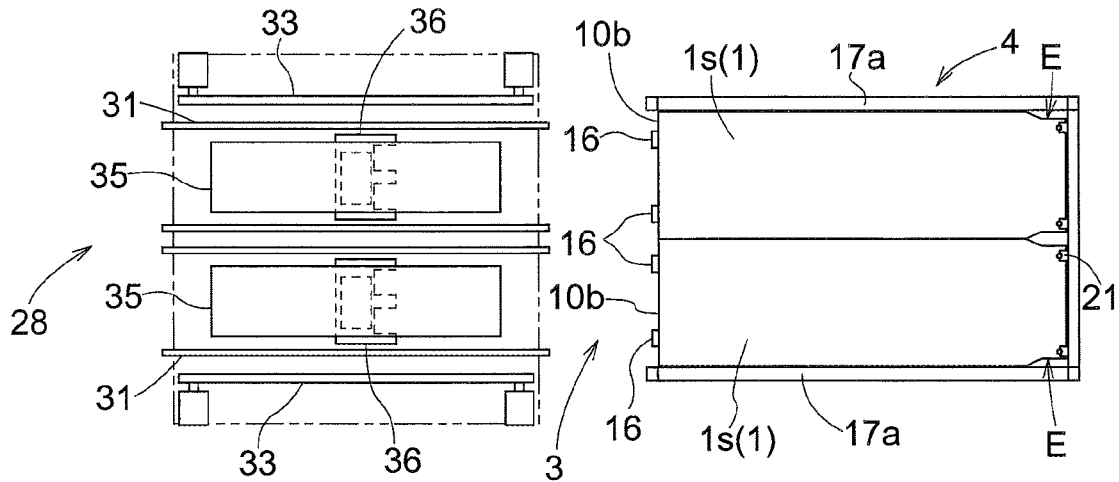
FIG. 14 is a drawing showing how the article transfer device functions when storing or retrieving two servers.
Figure 15:
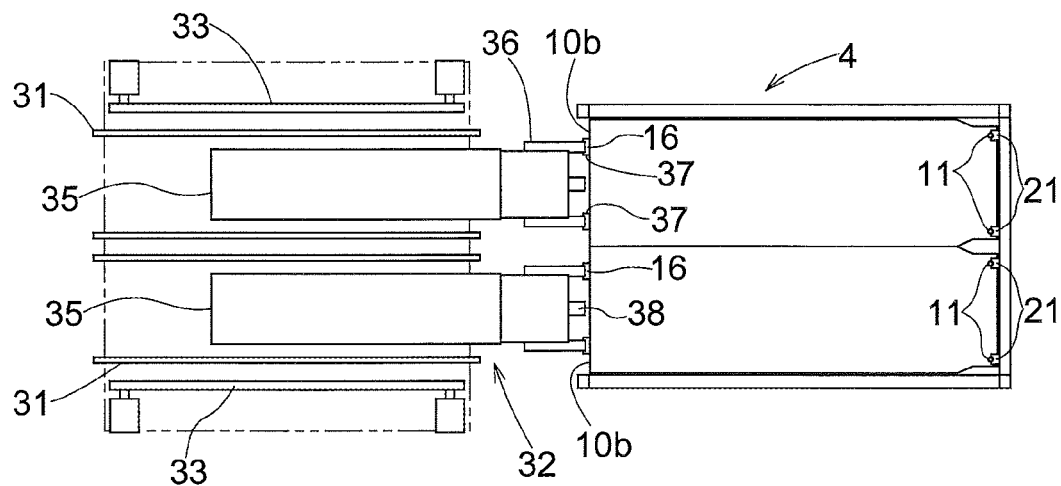
FIG. 15 is a drawing showing how the article transfer device functions when storing or retrieving two servers.
Figure 16:
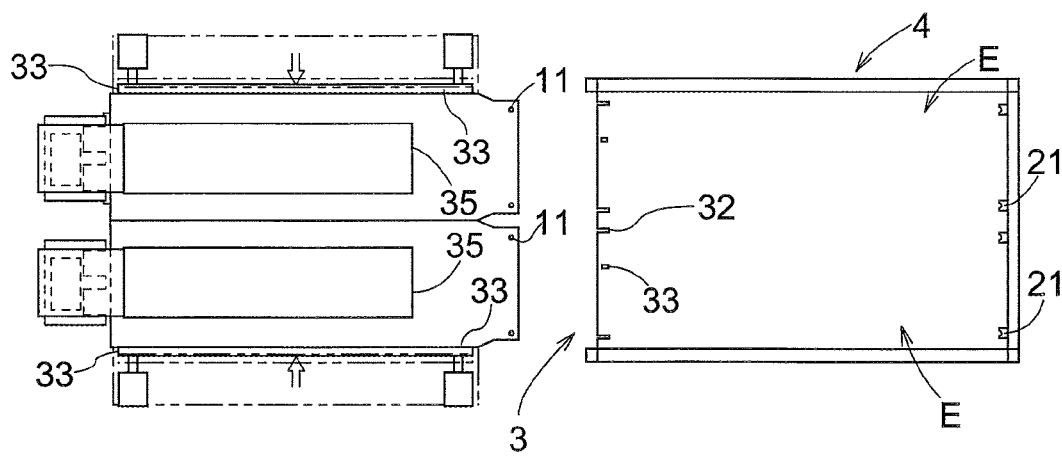
FIG. 16 is a drawing showing how the article transfer device functions when storing or retrieving two servers.
Figure 17:
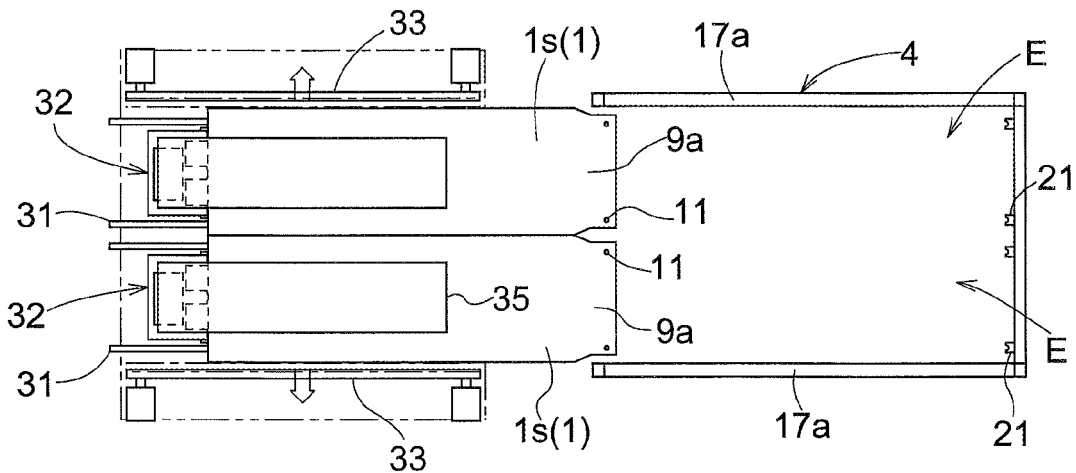
FIG. 17 is a drawing showing how the article transfer device functions when storing or retrieving two servers.
Figure 18:
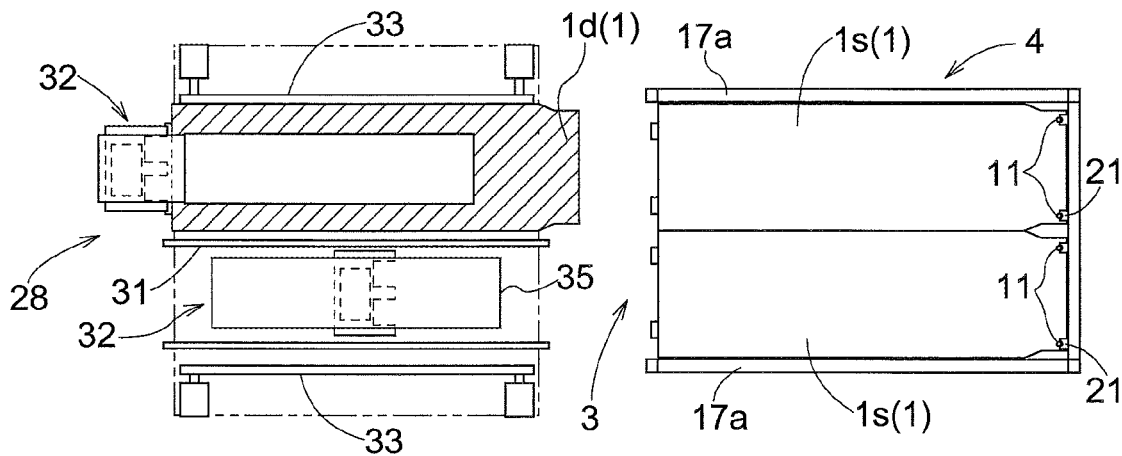
FIG. 18 is a drawing showing how the article transfer device functions when storing or retrieving one server.
Figure 19:
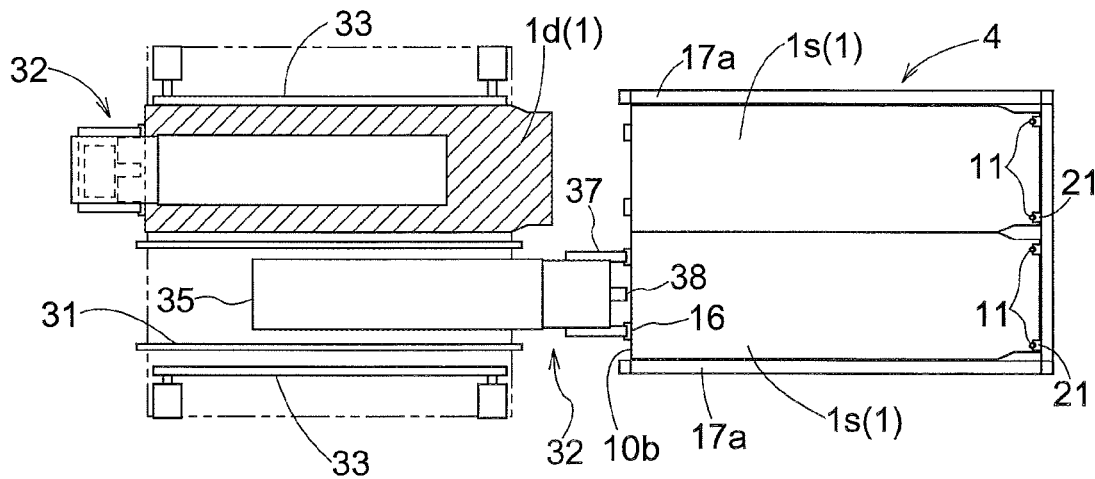
FIG. 19 is a drawing showing how the article transfer device functions when storing or retrieving one server.
Figure 20:
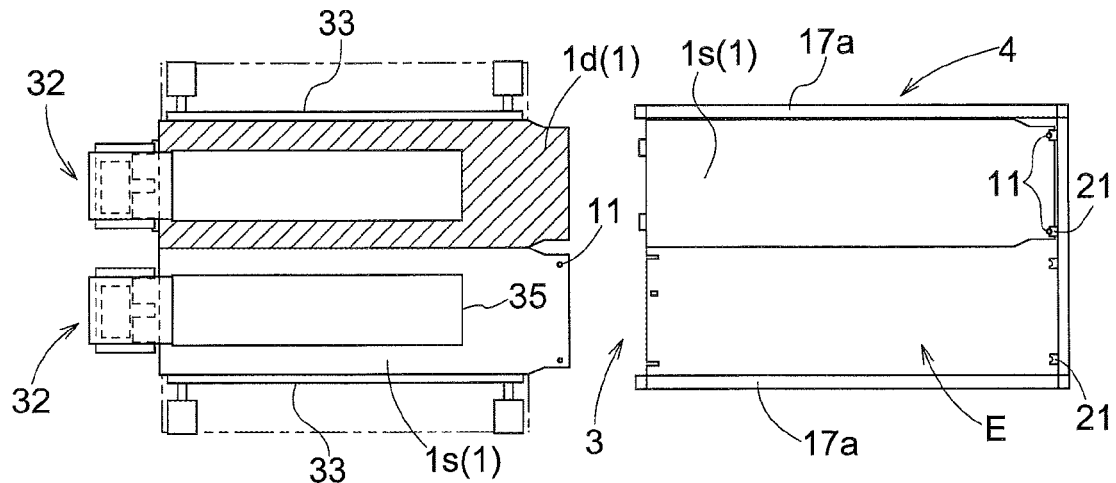
FIG. 20 is a drawing showing how the article transfer device functions when storing or retrieving one server.

A double retrieval control is a control for causing a pair of articles 1 (a pair of servers 1s) stored in a storage portion 3 to be moved from the storage areas E to the support portion 31 as shown in FIGS. 14-16. A double storage control is a control for causing a pair of articles 1 (a pair of servers 1s) supported by the support portion 31 to be moved from the support portion 31 to storage areas E as shown in FIGS. 16, 17, 15, and 14, in that order. A single retrieval control is a control for causing one (one server 1s) of the pair of the articles 1 (a pair of servers 1s) stored in a storage portion 3 to be moved from a storage area E to the support portion 31, as shown in FIG. 18-FIG. 20. A single storage control is a control for causing one (one server 1s) of a pair of articles 1 (a server 1s and a dummy article 1d) supported by the support portion 31 to be moved from the support portion 31 to a storage area E, as shown in FIGS. 20, 21, 19, and 18 in that order.

A movement control, a transfer control, and a correction control are described further next using an example in which the transfer target portion is one or both of storage areas E of a storage portion 3. Note that, the description for when a transfer target portion is the carry-out conveyor 5 or the carry-in conveyor 6 is omitted here since the operation of the stacker crane 2 in such a case is identical to the operation for which the transfer target portion is a storage areas E of a storage portion 3.

The information that indicates target stop locations is stored in the controller H. The target stop locations are set with one for each of the plurality of storage portions 3 in each of the plurality of storage racks 4. A target stop location for a storage portion 3 is such a stop location for the vertically movable member 28 that allows transferring of an article 1 between the storage portion 3 and the support portion 31. And one target stop location is set for each storage portion 3. And in a movement control, the operations of the first motor M1 and the second motor M2 are controlled in order to cause the vertically movable member 28 to be moved to a target stop location, and, when required, the operation of the sixth motor M6 is controlled so that the storage portion 3 that is the transfer target exists in the direction in which the transfer mechanism 32 projects.

In a correction control, the sixth motor M6, the seventh motor M7, and the eighth motor M8 are controlled to correct the attitude of the article transfer device 30 based on image information captured by the imaging device 47 and distance information obtained by the distance sensor 48.

More specifically, in a correction control, if it is determined, based on image information captured by the imaging device 47 and distance information obtained by the distance sensor 48, that the attitude of the article transfer device 30 deviates angularly about an axis extending along the front-and-back direction Z from the proper attitude for a storage portion 3, then the eighth motor M8 of the swing mechanism 43 is controlled such that the angular attitude about the axis along the front-and-back direction Z matches the proper attitude.

In addition, in a correction control, if it is determined, based on the image information captured by the imaging device 47 and the distance information obtained by the distance sensor 48, that the position of the article transfer device 30 along the lateral direction X deviates from the proper position for a storage portion 3 along the lateral direction X, then the seventh motor M7 of the sliding mechanism 44 is controlled such that the position of the article transfer device 30 along the lateral direction X matches the proper position.

In addition, in a correction control, if it is determined, based on the image information captured by the imaging device 47 and the distance information obtained by the distance sensor 48, that the position of the article transfer device 30 along the vertical direction Y deviates from the proper position for a storage portion 3 along the vertical direction Y, then the second motor M2 is controlled such that the position of the article transfer device 30 along the vertical direction Y matches the proper position.

A transfer control is described next.

When initiating a double retrieval control, no articles 1 are supported by the support portion 31 whereas two servers 1s are stored in a storage portion 3, as shown in FIG. 14. In addition, the distance between the pair of guide members 33 is set to be the second distance.

And, as shown in FIG. 15, in the double retrieval control, the pair of the fork mechanisms 35 are projected until the interlocking portions 37 contact the front wall portions 10b of the servers 1s stored in the storage portion 3, then the interlocking portions 37 of the pair of fork mechanisms 35 are lowered from the second height to the first height to cause the interlocking portions 37 to be interlocked with the interlocked portions 16 of the servers 1s and also to cause the operating portions 38 to operate the operated portions 15a of the lock mechanisms 13 to switch the lock mechanisms 13 from the locking state to the lock release state. Subsequently, as shown in FIG. 16, the pair of fork mechanisms 35 are retracted to a pull out position to move together the two servers 1s, stored in the storage portion 3, from the storage portion 3 to the support portion 31. Thereafter, the distance between the pair of guide members 33 is changed from the second distance to the first distance.

When initiating a double storage control, two servers 1s are supported by the support portion 31 whereas no servers 1s are stored in a storage portion 3, as shown in FIG. 16. In addition, the distance between the pair of guide members 33 is set to be the first distance.

And, as shown in FIG. 15, in the double storage control, the pair of the fork mechanisms 35 are projected until the first engaging portions 11 of the servers 1s to be stored contact the first engaged portions 21, then the interlocking portions 37 of the pair of fork mechanisms 35 are raised from the first height to the second height to cause the interlocking portions 37 to be released upward from the interlocked portions 16 of the servers 1s and also to cause the operating portions 38 to release the operated portions 15a of the lock mechanisms 13 to switch the lock mechanisms 13 from the lock release state to the locking state. In addition, the distance between the pair of guide members 33 is changed to from the first distance to the second distance while the two servers 1s are being so moved, or more specifically, when, as shown in FIG. 17, the back end portions 9a of the servers 1s being moved and the forward ends of the side walls 17a overlap along the front-and-back direction Z. Subsequently, as shown in FIG. 14, the pair of fork mechanisms 35 are retracted to a reference position.

When initiating a single retrieval control, one dummy article 1d is supported by the support portion 31 whereas two servers 1s are stored in a storage portion 3, as shown in FIG. 18. In addition, the distance between the pair of guide members 33 is set to be the second distance.

And, as shown in FIG. 19, in the single retrieval control, one of the fork mechanisms 35 in the pair is projected until the interlocking portion 37 contacts the front wall portion 10b of the server 1s stored in the storage portion 3, then the interlocking portion 37 of that fork mechanism 35 is lowered from the second height to the first height to cause the interlocking portion 37 to be interlocked with the interlocked portion 16 of the server 1s and also to cause the operating portion 38 to operate the operated portion 15a of the lock mechanism 13 to switch the lock mechanism 13 from the locking state to the lock release state. Subsequently, as shown in FIG. 20, one of the fork mechanisms 35 in the pair is retracted to a pull out position to move one of the two servers 1s, stored in the storage portion 3, from the storage portion 3 to the support portion 31. Thereafter, the distance between the pair of guide members 33 is changed from the second distance to the first distance.

When initiating a single storage control, a server 1s and a dummy article 1d are supported by the support portion 31 whereas one server 1s is stored in a storage portion 3, as shown in FIG. 20. In addition, the distance between the pair of guide members 33 is set to be the first distance.

Figure 21:
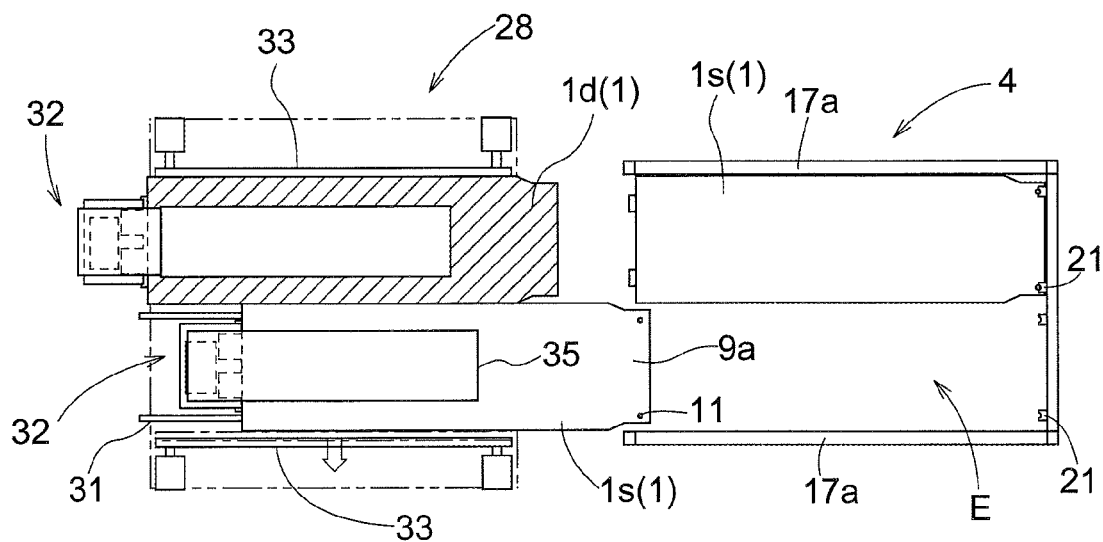
FIG. 21 is a drawing showing how the article transfer device functions when storing or retrieving one server.

And, as shown in FIG. 19, in the single storage control, one of the fork mechanisms 35 in the pair is projected until the first engaging portions 11 of the server 1s to be stored contact the first engaged portions 21, then the interlocking portion 37 of the one of fork mechanisms 35 in the pair is raised from the first height to the second height to cause the interlocking portion 37 to be released upward from the interlocked portion 16 of the server 1s and also to cause the operating portion 38 to release the operated portion 15a of the lock mechanism 13 to switch the lock mechanism 13 from the lock release state to the locking state. In addition, the distance between the pair of guide members 33 is changed to from the first distance to the second distance while the one server 1s is being so moved, or more specifically, when, as shown in FIG. 21, the back end portion 9a of the server 1s being moved and the forward ends of the side walls 17a overlap along the front-and-back direction Z. Subsequently, as shown in FIG. 14, the one fork mechanism 35 is retracted to the reference position.

As described above, the fork mechanisms 35 for guiding the interlocking portions 37 along the front-and-back direction Z and the third motors M3 for moving the interlocking portions 37 along the front-and-back direction Z are located higher than the articles 1 supported by the support portion 31. Thus, the portion of the vertically movable member 28 that is lower than the support portion 31 can be made to have smaller dimension along the vertical direction Y. And so, as shown in FIG. 11, the vertically movable member 28 can be lowered to a height at which the lower ends of the support portion 31 are located lower than the top surfaces of the guide rails 25.

[Alternative Embodiments]

(1) In the embodiment described above, the length of the support portion along the front-and-back direction is shorter than the distance between the pair of guide rails along the front-and-back direction; and, the support portion is so located to be between the pair of guide rails along the front-and-back direction. However, the length of the support portion along the front-and-back direction may be longer than the distance between the pair of guide rails along the front-and-back direction; and, the support portion may be so located to overlap with the pair of guide rails as seen along a vertical direction.

Also, in the embodiment described above, the support portion is so located that it does not overlap with the travel portion as seen along the vertical direction. However, for example, a pair of support columns that are spaced apart from each other along the front-and-back direction may be installed vertically on the travel carriage with the vertically movable member located between the support columns; so, the support portion may be so located to overlap with the travel portion as seen along the vertical direction.

(2) In the embodiment described above, transfer target portions are located on both sides, along the front-and-back direction, of the movable member at rest at a target stop location. However, transfer target portions may be located only on one side, along the front-and-back direction, of the movable member at rest at a target stop location.

(3) In the embodiment described above, an interlocking portion is caused to be interlocked with interlocked portions by lowering the interlocking portion to the first height whereas the interlocking portion is released from interlocked portions by raising the interlocking portion to the second height. However, how an interlocking portion is caused to be interlocked with interlocked portions may be changed suitably.

More specifically, an arrangement may be such that an interlocking portion is caused to be interlocked with interlocked portions by raising the interlocking portion to an interlocking height whereas the interlocking portion is released from interlocked portions by lowering the interlocking portion to a release height. Alternatively, an arrangement may be such that an interlocking portion is caused to be interlocked with, and is released from, interlocked portions by swinging the interlocking portion about an axis extending along the front-and-back direction.

(4) In the embodiment described above, two articles supported by the support portion and adjacent to each other along the lateral direction are described to form a first article group. However, a first article group may be formed by three or more articles supported by the support portion and arranged one adjacent to another along the lateral direction. In this case, the support portion would be configured to be capable of supporting three or more articles arranged one adjacent to another along the lateral direction.

In addition, two articles supported by a storage rack and adjacent to each other along the lateral direction formed a second article group. However, a second group may be formed by three or more articles supported by a storage rack and arranged one adjacent to another along the lateral direction. In this case, a storage portion would define three or more storage areas arranged one adjacent to another along the lateral direction.

And, when, for example, the first group is formed by three articles supported by the support portion and arranged one adjacent to another along the lateral direction and the only article to be transferred is the one located in the middle along the lateral direction among these three articles, and this one article, to be transferred, is to be moved along the front-and-back direction by means of the transfer mechanism to move it from the support portion to a storage area, then the transfer mechanism moves the article being transferred along the front-and-back direction by guiding one lateral side portion of the article being transferred with one of the first article group that is not the article being transferred (the article located to one side of the article being transferred), and by guiding the other lateral side portion of the article being transferred by the other of the first article group that is not the article being transferred (the article located to the other side of the article being transferred).

(5) In the embodiment described above, a plurality of storage portions are arranged one above another along the vertical direction and a plurality of storage portions are arranged one adjacent to another along the lateral direction.

However, a plurality of storage portions are arranged one above another only along the vertical direction or only along the lateral direction.

In addition, an article is either a server or a dummy article in the embodiment above. However, an article may be something different from these as desired, such as, a pallet for supporting a load, or a container for holding a load.

(6) In the embodiment described above, an interlocking portion consists of a pair of interlocking members; however, an interlocking portion may consist of one interlocking member or of three or more interlocking members. In addition, to have the corresponding number of interlocked portion(s), an article may have only one interlocked portion, or three or more interlocked portions. Incidentally, the number of interlocking portions may be different from the number of interlocked portions. For example, a plurality of interlocking portions may be interlocked with one interlocked portion.

In the embodiment described above, the interlocking portion (each of the interlocking members of a pair) is formed to be generally flat and thin which extends along the vertical direction Y and along the front-and-back direction Z. However, the shape of the interlocking portion may be changed as desired so long as it has a shape that allows it to be interlocked with an interlocked portion. For example, the interlocking portion may be generally formed in a shape of a circular rod.

In other words, an interlocking portion may consist of only one interlocking member, which may be generally formed in a shape of a circular rod that extends vertically. More specifically, an interlocking portion may be configured as follows.

Figure 22:
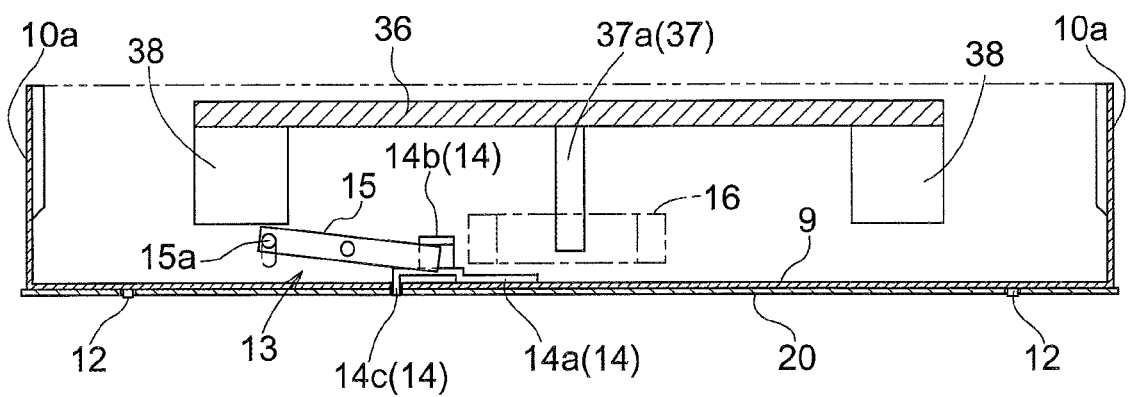
FIG. 22 is a front view of an interlocking portion and an interlocked portion in the alternative embodiment 6.

As shown in FIG. 22, the interlocked portion 16 is located only in the central area, along the lateral direction X, of the front wall portion 10b of an article 1. The interlocking portion 37 consists of one interlocking member 37a generally formed in a shape of a circular rod extending along the vertical direction Y. In addition, the interlocked portion 16 and the interlocking member 37a are formed such that the inner dimension, along the lateral direction X, of the generally U-shaped interlocked portion 16 is greater than the outer dimension, along the lateral direction X, of the interlocking member 37a. And the interlocking member 37a is interlocked with the interlocked portion 16 such that the interlocking member 37a can move with respect to the interlocked portion 16 along the lateral direction X.

Figure 23:
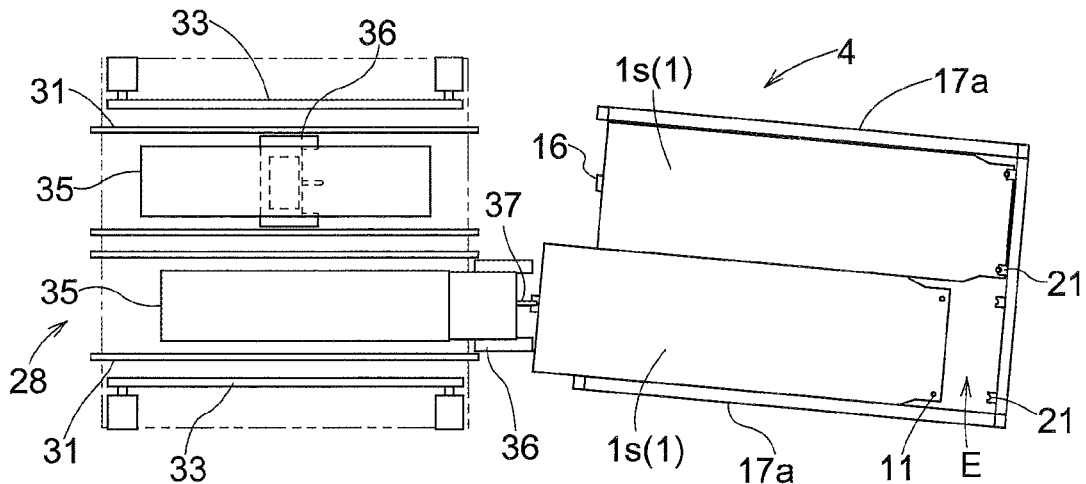
FIG. 23 is a plan view showing the state in which the servers are at an angle with respect to the transfer device in the alternative embodiment 6.

By generally forming the interlocking member 37a in a shape of a circular rod extending along the vertical direction Y, As shown in FIG. 23, even when the interlocking portion 37 is interlocked with the interlocked portion 16 of the article 1, it is easier for the article 1 to be swung about the interlocking portion 37.

In addition, as shown in FIG. 22, the operated portion 15a of the lock mechanism 13 of an article 1 projects from a portion of the front wall portion 10b of the article 1 that is located to one side of the center along the lateral direction X. The operating portion 38 is formed to be generally flat and thin which extends along the vertical direction Y and along the lateral direction X. An operating portion 38 is located to each of one and the other side, along the lateral direction, of the interlocking member 37a.

By providing the transfer mechanism 32 with a pair of operating portions 38 as described above, the lock mechanism 13 of the article 1 can be unlocked regardless of whether the operated portion 15a projects from a portion of the front wall portion 10b of the article 1 that is located to one side of the center along the lateral direction X or to the other side. Note that, if it can be assumed that the operated portion 15a projects only from a portion of the front wall portion 10b of the article 1 that is located to one side of the center along the lateral direction X, then the interlocking member 37a can be located to only one side, along the lateral direction X, of the operating portion 38.

(7) In the embodiment described above, no dummy articles are stored in the storage portions. However, dummy articles may be stored in the storage portions. When dummy articles are stored in storage portions in place of servers, each dummy article may be provided with interlocked portion(s), first engaging portion, second engaging portion, a lock mechanism, etc.

Figure 24:
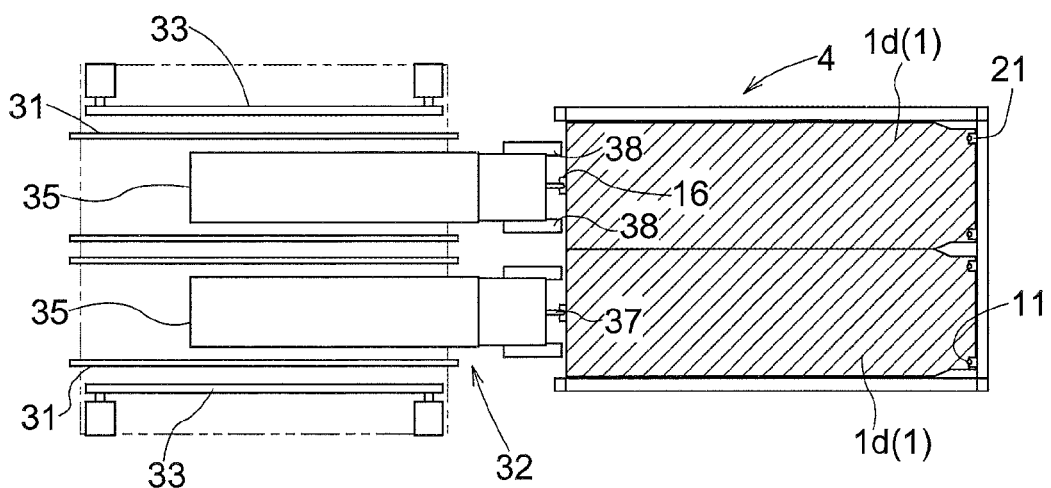
FIG. 24 is a drawing showing how the article transfer device functions when storing or retrieving two dummy articles in the alternative embodiment 7.

More specifically, as shown in FIG. 24, two dummy articles 1d may be designated as the articles to be transferred; and, the pair of dummy article 1d supported by the support portion 31 of the vertically movable member 28 may be moved from the support portion 31 to storage areas E by performing a double storage control. In addition, a pair of dummy articles 1d stored in the storage areas E of a storage portion 3 may be moved from the storage areas E to the support portion 31 through a double retrieval control.

Figure 25:
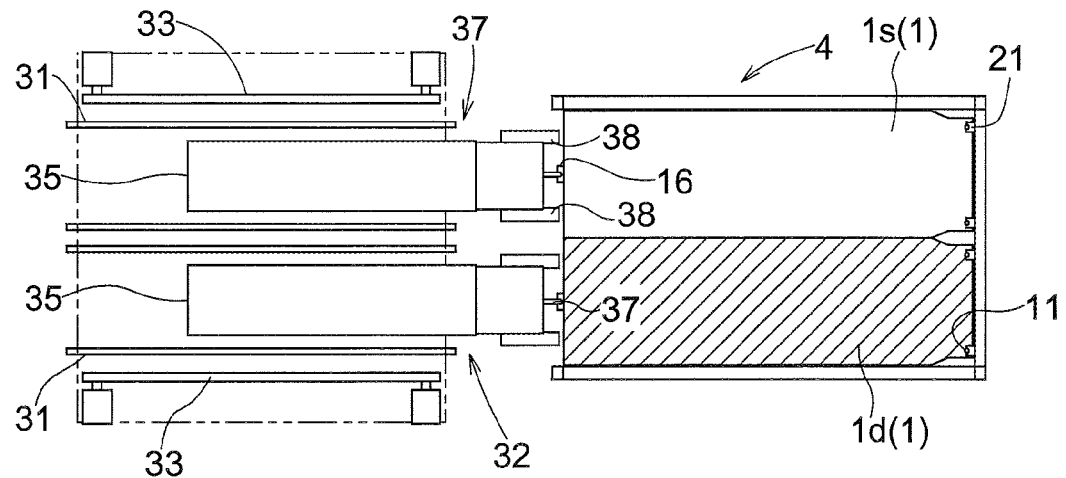
FIG. 25 is a drawing showing how the article transfer device functions when storing or retrieving one dummy article and one server in the alternative embodiment 7.

Also, as shown in FIG. 25, one server 1s and one dummy article 1d may be designated as the articles to be transferred; and, one server 1s and one dummy article 1d supported by the support portion 31 of the vertically movable member 28 may be moved from the support portion 31 to storage areas E by performing a double storage control. In addition, one server 1s and one dummy article 1d stored in the storage areas E of a storage portion 3 may be moved from the storage areas E to the support portion 31 through a double retrieval control.

Figure 26:
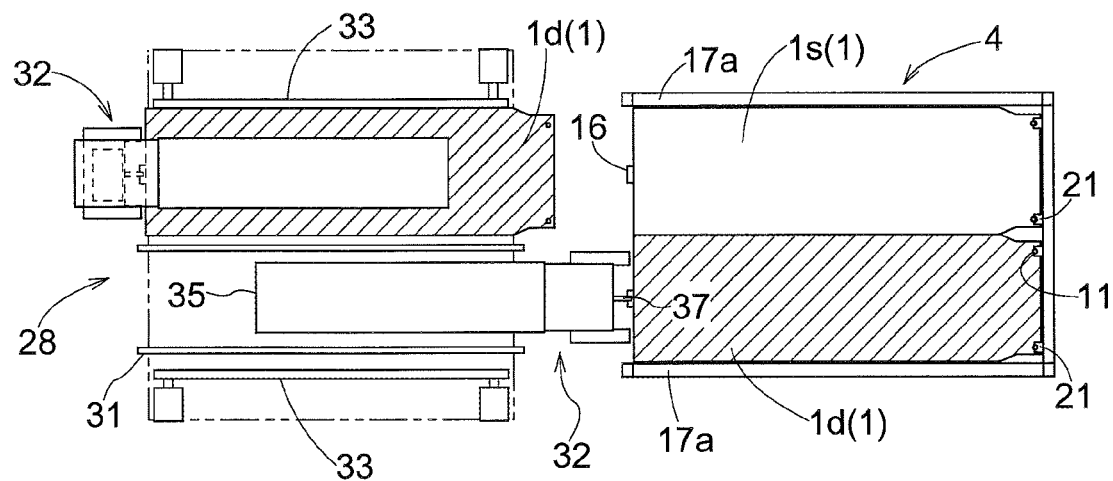
FIG. 26 is a drawing showing how the article transfer device functions when storing or retrieving one dummy article in the alternative embodiment 7.

Also, as shown in FIG. 26, one dummy article 1d may be designated as the article to be transferred; and, only one dummy article 1d (out of one server 1s and one dummy article 1d supported by the support portion 31 of the vertically movable member 28) may be moved from the support portion 31 to a storage area E by performing a single storage control. Also, only one dummy article 1d (out of one server 1s and one dummy article 1d stored in the storage areas E of a storage portion 3) may be moved from a storage area E to the support portion 31 through a single retrieval control.

[Summary of Embodiments Described Above]

A brief summary of the article transport apparatus described above is provided next.

An article transport apparatus comprises: a movable member having a support portion for supporting an article from below; and first actuators for moving the movable member, characterized in that the movable member includes a transfer mechanism for moving an article between the support portion and a transfer target portion, to or from which the article is to be transferred, with the support portion and transfer target portion in alignment with each other, wherein, with a target stop location being a location at which the movable member is stopped when moving an article between the support portion and the transfer target portion with the transfer mechanism, with a front-and-back direction being a direction along which the movable member and the transfer target portion are spaced apart from each other as seen along the vertical direction when the movable member is located at the target stop location, and with a lateral direction being a direction that crosses the front-and-back direction as seen along the vertical direction, the transfer mechanism includes an interlocking portion capable of being interlocked with an article along the front-and-back direction, a first guide portion for guiding the interlocking portion along the front-and-back direction, and a second actuator for moving the interlocking portion along the front-and-back direction, wherein the transfer mechanism moves an article between the support portion and the transfer target portion by moving the interlocking portion along the front-and-back direction by means of the second actuator with the movable member located at the target stop location, and wherein the first guide portion and the second actuator are located higher than an article supported by the support portion.

With such an arrangement, an article, with which the interlocking portion is interlocked, is moved between the support portion and the transfer target portion by moving the interlocking portion along the front-and-back direction by means of the second actuator with the movable member located at the target stop location.

And the first guide portion for guiding the interlocking portion along the front-and-back direction and the second actuator for moving the interlocking portion along the front-and-back direction are located higher than an article supported by the support portion. Thus, it is not necessary to locate either the first guide portion or the second actuator lower than the support portion. Thus a portion of the movable member that is located lower than the support portion can be made smaller in size along the vertical direction. Accordingly, the movable member can be arranged, or can be lowered further, such that the support portion can be located at a lower height, compared with a case where the first guide portion and the second actuator are located lower than the support portion, which makes it possible to transfer articles to and from transfer target portions at low heights.

Here, the transfer mechanism preferably further includes a third actuator for moving the interlocking portion to a first height at which the interlocking portion is interlocked with an interlocked portion of an article, and to a second height at which the interlocking portion is released from the interlocked portion and is retracted upward from the interlocked portion, wherein the third actuator is preferably located higher than an article supported by the support portion.

With such an arrangement, the third actuator for moving the interlocking portion along the vertical direction is located higher than an article supported by the support portion, as with the first guiding portion and the second actuator. Thus, the first guide portion for guiding the interlocking portion along the front-and-back direction, the second actuator for moving the interlocking portion along the front-and-back direction, and the third actuator for moving the interlocking portion along the vertical direction can all be located higher than an article supported by the support portion. This arrangement makes it easier to couple movement of an interlocking portion along the front-and-back direction with its movement along the vertical direction, which can simplify the structure of the transfer mechanism.

In addition, the transfer target portions are preferably located on both sides, along the front-and-back direction, of the movable member stopped at the target stop location, wherein the movable member preferably includes a fourth actuator for rotating the transfer mechanism through at least 180 degrees about an axis extending along a vertical direction, and wherein the fourth actuator is preferably located higher than an article supported by the support portion.

With such an arrangement, the direction in which an article is moved can be switched from one sense or direction along the front-and-back direction to the other sense or direction by rotating the transfer mechanism through 180 degrees with the fourth actuator. Thus, even if the transfer mechanism operates to transfer an article only between a transfer target portion that is located on one side along the front-and-back direction and the support portion, it becomes possible for the transfer mechanism to transfer an article between a transfer target portion that is located on the other side along the front-and-back direction and the support portion by rotating the transfer mechanism through 180 degrees with the fourth actuator. Thus, while keeping the structure and arrangement of the transfer mechanism simple, the transfer mechanism can transfer an article between the support portion and either of the transfer target portions on both sides along the front-and-back direction by rotating the transfer mechanism.

Also, a pair of guide rails extending along the lateral direction are preferably so located to be spaced apart from each other along the front-and-back direction, wherein the article transport apparatus preferably further comprises: a travel portion for traveling on the pair of guide rails along the lateral direction; and a second guide portion which is arranged vertically on the travel portion to guide the movable member along the vertical direction, wherein the first actuators preferably include a travel actuator which causes the travel portion to travel, and a vertical movement actuator for moving the movable member along the second guide portion along the vertical direction, and wherein the support portion is preferably so located to be between the pair of guide rails along the front-and-back direction and is so located that the support portion does not overlap with the travel portion, as seen along a vertical direction.

With such an arrangement, the movable member is moved along the lateral direction as the travel portion is caused to travel by the travel actuator, and is moved along the vertical direction as the movable member is moved along the second guide portion by the vertical movement actuator. And the support portion is so located to be between the pair of guide rails along the front-and-back direction and is so located that the support portion does not overlap with the travel portion, as seen along a vertical direction; so, the support portion would not come into contact with either the pair of guide rails or the travel portion when the movable member is lowered. Therefore, the movable member can be lowered to a lower height compared, for example, with a case where the support portion is so located to overlap with a guide rail or the travel portion as seen along the vertical direction.

In addition, the movable member preferably includes a third guide portion for contacting an article from a lateral side to guide the article along the front-and-back direction when the article is moved by the transfer mechanism, wherein the third guide portion is preferably located, along a vertical direction, between the support portion on the one hand and the first guide portion and the second actuator on the other hand.

With such an arrangement, since the third guide portion is located, along a vertical direction, between the support portion on the one hand and the first guide portion and the second actuator on the other hand, the first guide portion and the second actuator can be located to overlap with the third guide portion as seen along the vertical direction. Thus, it is easier to make the dimension of the movable member along the lateral direction smaller compared with a case where these are located adjacent to one another along the lateral direction.

In addition, an article preferably has an interlocked portion, with which the interlocking portion is capable of being interlocked, at an end portion on a side opposite from a side, along the front-and-back direction, on which a transfer target portion is located when the article is supported by the support portion, wherein the interlocking portion is preferably so formed that at least a portion thereof that is capable of being interlocked with the interlocked portion is formed in a shape of a circular rod that extends along a vertical direction.

There are situations in which, because, for example, the transfer target portion being at an angle with the moving direction of the interlocking portion, the direction in which the article being transferred is moved by the movement of the interlocking portion does not match with the direction in which the article being transferred is guided within the transfer target portion, as seen along the vertical direction. Even in such a situation, because the interlocked portion of the article is interlocked with a portion of the interlocking portion that is formed in a shape of a circular rod, it is easier for the article to swing about the interlocking portion. And by allowing the article to swing about the interlocking portion, it becomes easier for the article to change its orientation to an appropriate orientation for the transfer target portion, which makes it possible to avoid any damages to the article while guided in the transfer target portion.

DESCRIPTION OF REFERENCE NUMERALS AND SYMBOLS

1 Article
1s Server (Article)
1d Dummy article (Article)
2 Stacker crane (Article Transport Apparatus)
25 Guide rail
26 Travel carriage (Travel portion)
27 Support Column (Second guide portion)
28 Vertically movable member (Movable member)
31 Support portion
32 Transfer mechanism
33 Guide member (Third guide portion)
35 Fork mechanism (First guide portion)
37 Interlocking portion
M1 First motor (Travel actuator, First actuator)
M2 Second motor (Vertical movement actuator, First actuator)
M3 Third motor (Second actuator)
M4 Fourth motor (Third actuator)
X Lateral direction
Y Vertical direction
Z Front-and-back direction

The invention claimed is:
1. An article transport apparatus comprising:
a movable member having a support portion for supporting an article from below; and
first actuators for moving the movable member,
wherein:
the movable member includes a transfer mechanism for moving an article between the support portion and a transfer target portion to or from which the article is to be transferred when the support portion and transfer target portion are in alignment with each other,
a target stop location is a location at which the movable member is stopped when moving an article between the support portion and the transfer target portion with the transfer mechanism,
a front-and-back direction is a direction along which the movable member and the transfer target portion are spaced apart from each other as seen along the vertical direction when the movable member is located at the target stop location, and
a lateral direction is a direction that crosses the front-and-back direction as seen along the vertical direction,
the transfer mechanism includes an interlocking portion capable of being interlocked with an article along the front-and-back direction, a first guide portion for guiding the interlocking portion along the front-and-back direction, and a second actuator for moving the interlocking portion along the front-and-back direction,
the transfer mechanism moves an article between the support portion and the transfer target portion by moving the interlocking portion along the front-and-back direction by use of the second actuator with the movable member located at the target stop location, and
the first guide portion and the second actuator are located higher than an article supported by the support portion,
a pair of guide rails extending along the lateral direction are so located to be spaced apart from each other along the front-and-back direction, and
the article transport apparatus further comprises:
a travel portion for traveling on the pair of guide rails along the lateral direction; and
a second guide portion which is arranged vertically on the travel portion to guide the movable member along the vertical direction,
wherein the first actuators include a travel actuator which causes the travel portion to travel, and a vertical movement actuator for moving the movable member along the second guide portion along the vertical direction,
wherein the movable member includes a support member supported by the second guide portion, and
wherein the support member supports the first guide portion and the second actuator from above.

2. The article transport apparatus as defined in claim 1, wherein the transfer mechanism further includes a third actuator for moving the interlocking portion to a first height at which the interlocking portion is interlocked with an interlocked portion of an article, and to a second height at which the interlocking portion is released from the interlocked portion and is retracted upward from the interlocked portion, and
wherein the third actuator is located higher than an article supported by the support portion.

3. The article transport apparatus as defined in claim 1, wherein the transfer target portions are located on both sides, along the front-and-back direction, of the movable member stopped at the target stop location,
wherein the movable member includes a fourth actuator for rotating the transfer mechanism through at least 180 degrees about an axis extending along a vertical direction, and
wherein the fourth actuator is located higher than an article supported by the support portion.

4. The article transport apparatus as defined in claim 1, wherein a pair of guide rails extending along the lateral direction are so located to be spaced apart from each other along the front-and-back direction,
wherein the article transport apparatus further comprises:
a travel portion for traveling on the pair of guide rails along the lateral direction; and
a second guide portion which is arranged vertically on the travel portion to guide the movable member along the vertical direction,
wherein the first actuators include a travel actuator which causes the travel portion to travel, and a vertical movement actuator for moving the movable member along the second guide portion along the vertical direction, and wherein the support portion is so located to be between the pair of guide rails along the front-and-back direction and is so located that the support portion does not overlap with the travel portion, as viewed along a vertical direction.

5. The article transport apparatus as defined in claim 1, wherein the movable member includes a third guide portion for contacting an article from a lateral side to guide the article along the front-and-back direction when the article is moved by the transfer mechanism, and
   wherein the third guide portion is located along a vertical direction between the support portion on the one hand and the first guide portion and the second actuator on the other hand.

6. The article transport apparatus as defined in claim 1, wherein an article has an interlocked portion, with which the interlocking portion is capable of being interlocked, at an end portion on a side opposite from a side, along the front-and-back direction, on which a transfer target portion is located when the article is supported by the support portion,
   wherein the interlocking portion is so formed that at least a portion thereof that is capable of being interlocked with the interlocked portion is formed in a shape of a circular rod that extends along a vertical direction.

7. The article transport apparatus as defined in claim 2, wherein the transfer target portions are located on both sides, along the front-and-back direction, of the movable member stopped at the target stop location,
   wherein the movable member includes a fourth actuator for rotating the transfer mechanism through at least 180 degrees about an axis extending along a vertical direction, and
   wherein the fourth actuator is located higher than an article supported by the support portion.

8. The article transport apparatus as defined in claim 2, wherein a pair of guide rails extending along the lateral direction are so located to be spaced apart from each other along the front-and-back direction,
   wherein the article transport apparatus further comprises:
   a travel portion for traveling on the pair of guide rails along the lateral direction; and
   a second guide portion which is arranged vertically on the travel portion to guide the movable member along the vertical direction,
   wherein the first actuators include a travel actuator which causes the travel portion to travel, and a vertical movement actuator for moving the movable member along the second guide portion along the vertical direction, and
   wherein the support portion is so located to be between the pair of guide rails along the front-and-back direction and is so located that the support portion does not overlap with the travel portion, as viewed along a vertical direction.

9. The article transport apparatus as defined in claim 3, wherein a pair of guide rails extending along the lateral direction are so located to be spaced apart from each other along the front-and-back direction,
   wherein the article transport apparatus further comprises:
   a travel portion for traveling on the pair of guide rails along the lateral direction; and
   a second guide portion which is arranged vertically on the travel portion to guide the movable member along the vertical direction,
   wherein the first actuators include a travel actuator which causes the travel portion to travel, and a vertical movement actuator for moving the movable member along the second guide portion along the vertical direction, and
   wherein the support portion is so located to be between the pair of guide rails along the front-and-back direction and is so located that the support portion does not overlap with the travel portion, as viewed along a vertical direction.

10. The article transport apparatus as defined in claim 2, wherein the movable member includes a third guide portion for contacting an article from a lateral side to guide the article along the front-and-back direction when the article is moved by the transfer mechanism, and
    wherein the third guide portion is located along a vertical direction between the support portion on the one hand and the first guide portion and the second actuator on the other hand.

11. The article transport apparatus as defined in claim 3, wherein the movable member includes a third guide portion for contacting an article from a lateral side to guide the article along the front-and-back direction when the article is moved by the transfer mechanism, and
    wherein the third guide portion is located along a vertical direction between the support portion on the one hand and the first guide portion and the second actuator on the other hand.

12. The article transport apparatus as defined in claim 4, wherein the movable member includes a third guide portion for contacting an article from a lateral side to guide the article along the front-and-back direction when the article is moved by the transfer mechanism, and
    wherein the third guide portion is located along a vertical direction between the support portion on the one hand and the first guide portion and the second actuator on the other hand.

13. The article transport apparatus as defined in claim 2, wherein an article has an interlocked portion, with which the interlocking portion is capable of being interlocked, at an end portion on a side opposite from a side, along the front-and-back direction, on which a transfer target portion is located when the article is supported by the support portion,
    wherein the interlocking portion is so formed that at least a portion thereof that is capable of being interlocked with the interlocked portion is formed in a shape of a circular rod that extends along a vertical direction.

14. The article transport apparatus as defined in claim 3, wherein an article has an interlocked portion, with which the interlocking portion is capable of being interlocked, at an end portion on a side opposite from a side, along the front-and-back direction, on which a transfer target portion is located when the article is supported by the support portion,
    wherein the interlocking portion is so formed that at least a portion thereof that is capable of being interlocked with the interlocked portion is formed in a shape of a circular rod that extends along a vertical direction.

15. The article transport apparatus as defined in claim 4, wherein an article has an interlocked portion, with which the interlocking portion is capable of being interlocked, at an end portion on a side opposite from a side, along the front-and-back direction, on which a transfer target portion is located when the article is supported by the support portion,
    wherein the interlocking portion is so formed that at least a portion thereof that is capable of being interlocked with the interlocked portion is formed in a shape of a circular rod that extends along a vertical direction.

16. The article transport apparatus as defined in claim 5, wherein an article has an interlocked portion, with which the interlocking portion is capable of being interlocked, at an end portion on a side opposite from a side, along the front-and-back direction, on which a transfer target portion is located when the article is supported by the support portion,
wherein the interlocking portion is so formed that at least a portion thereof that is capable of being interlocked with the interlocked portion is formed in a shape of a circular rod that extends along a vertical direction.

17. The article transport apparatus as defined in claim 1, wherein the interlocking portion is located lower than the first guide portion, and
wherein the transfer mechanism moves an article along the front-and-back direction below the first guide portion by moving the interlocking portion along the front-and-back direction below the first guide portion.

18. An article transport apparatus comprising:
a movable member having a support portion for supporting an article from below; and
first actuators for moving the movable member, wherein:
the movable member includes a transfer mechanism for moving an article between the support portion and a transfer target portion to or from which the article is to be transferred when the support portion and transfer target portion are in alignment with each other,
a target stop location is a location at which the movable member is stopped when moving an article between the support portion and the transfer target portion with the transfer mechanism,
a front-and-back direction is a direction along which the movable member and the transfer target portion are spaced apart from each other as seen along the vertical direction when the movable member is located at the target stop location, and
a lateral direction is a direction that crosses the front-and-back direction as seen along the vertical direction,
the transfer mechanism includes an interlocking portion capable of being interlocked with an article along the front-and-back direction, a first guide portion for guiding the interlocking portion along the front-and-back direction, and a second actuator for moving the interlocking portion along the front-and-back direction,
the transfer mechanism moves an article between the support portion and the transfer target portion by moving the interlocking portion along the front-and-back direction by use of the second actuator with the movable member located at the target stop location,
the first guide portion and the second actuator are located higher than an article supported by the support portion,
the interlocking portion is interlocked with an interlocked portion of an article along a vertical direction and the interlocking portion is so formed that at least a portion that is capable of being interlocked with the interlocked portion is formed in a shape of a circular rod that extends along the vertical direction,
the transfer mechanism further includes a third actuator for moving the interlocking portion to a first height at which the interlocking portion is interlocked with the interlocked portion, and to a second height at which the interlocking portion is released from the interlocked portion and is retracted upward from the interlocked portion, and
the third actuator is located higher than an article supported by the support portion.

19. The article transport apparatus as defined in claim 18, wherein the transfer mechanism further includes a third actuator for moving the interlocking portion to a first height at which the interlocking portion is interlocked with an interlocked portion of an article, and to a second height at which the interlocking portion is released from the interlocked portion and is retracted upward from the interlocked portion, and
wherein the third actuator is located higher than an article supported by the support portion.

20. The article transport apparatus as defined in claim 18, wherein the transfer target portions are located on both sides, along the front-and-back direction, of the movable member stopped at the target stop location,
wherein the movable member includes a fourth actuator for rotating the transfer mechanism through at least 180 degrees about an axis extending along a vertical direction, and
wherein the fourth actuator is located higher than an article supported by the support portion.

21. The article transport apparatus as defined in claim 18, wherein a pair of guide rails extending along the lateral direction are so located to be spaced apart from each other along the front-and-back direction,
wherein the article transport apparatus further comprises:
a travel portion for traveling on the pair of guide rails along the lateral direction; and
a second guide portion which is arranged vertically on the travel portion to guide the movable member along the vertical direction,
wherein the first actuators include a travel actuator which causes the travel portion to travel, and a vertical movement actuator for moving the movable member along the second guide portion along the vertical direction, and
wherein the support portion is so located to be between the pair of guide rails along the front-and-back direction and is so located that the support portion does not overlap with the travel portion, as viewed along a vertical direction.

22. The article transport apparatus as defined in claim 18, wherein the movable member includes a third guide portion for contacting an article from a lateral side to guide the article along the front-and-back direction when the article is moved by the transfer mechanism, and
wherein the third guide portion is located along a vertical direction between the support portion on the one hand and the first guide portion and the second actuator on the other hand.

23. The article transport apparatus as defined in claim 18, wherein an article has an interlocked portion, with which the interlocking portion is capable of being interlocked, at an end portion on a side opposite from a side, along the front-and-back direction, on which a transfer target portion is located when the article is supported by the support portion,
wherein the interlocking portion is so formed that at least a portion thereof that is capable of being interlocked with the interlocked portion is formed in a shape of a circular rod that extends along a vertical direction.

24. The article transport apparatus as defined in claim 19, wherein the transfer target portions are located on both sides, along the front-and-back direction, of the movable member stopped at the target stop location, wherein the movable member includes a fourth actuator for rotating the transfer mechanism through at least 180 degrees about an axis extending along a vertical direction, and wherein the fourth actuator is located higher than an article supported by the support portion.

25. The article transport apparatus as defined in claim 19, wherein a pair of guide rails extending along the lateral direction are so located to be spaced apart from each other along the front-and-back direction, wherein the article transport apparatus further comprises:
a travel portion for traveling on the pair of guide rails along the lateral direction; and
a second guide portion which is arranged vertically on the travel portion to guide the movable member along the vertical direction,
wherein the first actuators include a travel actuator which causes the travel portion to travel, and a vertical movement actuator for moving the movable member along the second guide portion along the vertical direction, and
wherein the support portion is so located to be between the pair of guide rails along the front-and-back direction and is so located that the support portion does not overlap with the travel portion, as viewed along a vertical direction.

26. The article transport apparatus as defined in claim 20, wherein a pair of guide rails extending along the lateral direction are so located to be spaced apart from each other along the front-and-back direction, wherein the article transport apparatus further comprises:
a travel portion for traveling on the pair of guide rails along the lateral direction; and
a second guide portion which is arranged vertically on the travel portion to guide the movable member along the vertical direction,
wherein the first actuators include a travel actuator which causes the travel portion to travel, and a vertical movement actuator for moving the movable member along the second guide portion along the vertical direction, and
wherein the support portion is so located to be between the pair of guide rails along the front-and-back direction and is so located that the support portion does not overlap with the travel portion, as viewed along a vertical direction.

27. The article transport apparatus as defined in claim 19, wherein the movable member includes a third guide portion for contacting an article from a lateral side to guide the article along the front-and-back direction when the article is moved by the transfer mechanism, and wherein the third guide portion is located along a vertical direction between the support portion on the one hand and the first guide portion and the second actuator on the other hand.

28. The article transport apparatus as defined in claim 20, wherein the movable member includes a third guide portion for contacting an article from a lateral side to guide the article along the front-and-back direction when the article is moved by the transfer mechanism, and wherein the third guide portion is located along a vertical direction between the support portion on the one hand and the first guide portion and the second actuator on the other hand.

29. The article transport apparatus as defined in claim 21, wherein the movable member includes a third guide portion for contacting an article from a lateral side to guide the article along the front-and-back direction when the article is moved by the transfer mechanism, and wherein the third guide portion is located along a vertical direction between the support portion on the one hand and the first guide portion and the second actuator on the other hand.

30. The article transport apparatus as defined in claim 19, wherein an article has an interlocked portion, with which the interlocking portion is capable of being interlocked, at an end portion on a side opposite from a side, along the front-and-back direction, on which a transfer target portion is located when the article is supported by the support portion, wherein the interlocking portion is so formed that at least a portion thereof that is capable of being interlocked with the interlocked portion is formed in a shape of a circular rod that extends along a vertical direction.

31. The article transport apparatus as defined in claim 20, wherein an article has an interlocked portion, with which the interlocking portion is capable of being interlocked, at an end portion on a side opposite from a side, along the front-and-back direction, on which a transfer target portion is located when the article is supported by the support portion, wherein the interlocking portion is so formed that at least a portion thereof that is capable of being interlocked with the interlocked portion is formed in a shape of a circular rod that extends along a vertical direction.

32. The article transport apparatus as defined in claim 21, wherein an article has an interlocked portion, with which the interlocking portion is capable of being interlocked, at an end portion on a side opposite from a side, along the front-and-back direction, on which a transfer target portion is located when the article is supported by the support portion, wherein the interlocking portion is so formed that at least a portion thereof that is capable of being interlocked with the interlocked portion is formed in a shape of a circular rod that extends along a vertical direction.

33. The article transport apparatus as defined in claim 22, wherein an article has an interlocked portion, with which the interlocking portion is capable of being interlocked, at an end portion on a side opposite from a side, along the front-and-back direction, on which a transfer target portion is located when the article is supported by the support portion, wherein the interlocking portion is so formed that at least a portion thereof that is capable of being interlocked with the interlocked portion is formed in a shape of a circular rod that extends along a vertical direction.

34. The article transport apparatus as defined in claim 18, wherein the interlocking portion is located lower than the first guide portion, and wherein the transfer mechanism moves an article along the front-and-back direction below the first guide portion by moving the interlocking portion along the front-and-back direction below the first guide portion.

* * * * *

UNITED STATES PATENT AND TRADEMARK OFFICE
CERTIFICATE OF CORRECTION

PATENT NO. : 10,730,697 B2
APPLICATION NO. : 16/077788
DATED : August 4, 2020
INVENTOR(S) : Yuichi Ueda et al.

It is certified that error appears in the above-identified patent and that said Letters Patent is hereby corrected as shown below:

In the Claims

Column 22, Line 13, Claim 1, after "location," delete "and"

Signed and Sealed this
Fifteenth Day of December, 2020

Andrei Iancu
*Director of the United States Patent and Trademark Office*